US006674807B1

(12) United States Patent
Park et al.

(10) Patent No.: US 6,674,807 B1
(45) Date of Patent: Jan. 6, 2004

(54) COMMUNICATION APPARATUS AND METHOD FOR A CDMA COMMUNICATION SYSTEM

(75) Inventors: Chang-Soo Park, Seoul (KR); Jun-Jin Kong, Songnam-shi (KR); Hee-Won Kang, Seoul (KR); Jae-Yoel Kim, Kunpo-shi (KR); Jong-Seon No, Songnam-shi (KR); Kyeong-Cheol Yang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/489,235

(22) Filed: Jan. 21, 2000

(30) Foreign Application Priority Data

Jan. 21, 1999 (KR) .......................... 99-0002311

(51) Int. Cl.[7] .................... H04L 23/02; H04L 5/12
(52) U.S. Cl. ........................ 375/265; 714/792
(58) Field of Search ................ 375/265, 146, 375/141; 714/792, 758; 370/342, 335, 441

(56) References Cited

U.S. PATENT DOCUMENTS

| 5,383,204 A | | 1/1995 | Gibbs et al. ............ 371/37.7 |
|---|---|---|---|
| 5,511,073 A | * | 4/1996 | Padovani et al. ........... 370/471 |
| 5,666,370 A | | 9/1997 | Ganesan et al. ......... 371/37.01 |
| 5,754,734 A | | 5/1998 | Emeott et al. ............. 395/2.35 |
| 6,202,188 B1 | * | 3/2001 | Suzuki et al. ............... 714/758 |
| 6,256,355 B1 | * | 7/2001 | Sakoda et al. .............. 375/259 |
| 6,397,367 B1 | * | 5/2002 | Park et al. ................... 714/786 |

FOREIGN PATENT DOCUMENTS

WO      WO 99/63692     12/1999

* cited by examiner

*Primary Examiner*—Phoung Phu

(74) *Attorney, Agent, or Firm*—Dilworth & Barrese, LLP

(57) ABSTRACT

A communication device for a direct sequence code division multiple access (DS-CDMA) communication system is disclosed. The communication device comprises a CRC (Cyclic Redundancy Code) generator for generating CRC bits according to input data bits and adding the generated CRC bits to the input data bits; a channel encoder for encoding the CRC-added data bits using a coding rate R=1/6 convolutional code of a generator polynomial of (457, 755, 551, 637, 625, 727); and an interleaver for interleaving the coded data bits.

3 Claims, 24 Drawing Sheets

US 6,674,807 B1

COMMUNICATION APPARATUS AND METHOD FOR A CDMA COMMUNICATION SYSTEM

PRIORITY

This application claims priority to an application entitled "Communication Apparatus And Method for CDMA Communication System" filed in the Korean Industrial Property Office on Jan. 21, 1999 and assigned Serial No. 99-2311, the contents of which are hereby incorporated by reference.

BACKGROUND OF THE INVENTION

1. Field of the Invention

The present invention relates generally to a channel coding apparatus and method for a Code Division Multiple Access (CDMA) communication system, and in particular, to a channel coding apparatus and method for a DS (Direct Sequence)-CDMA communication system. Further, the present invention provides a channel decoding apparatus and method for receiving signals transmitted from a base station having the above channel coding apparatus.

2. Description of the Related Art

Current CDMA communication systems are implemented according to the IS-95 standard. With an increase in the sophistication of CDMA communication technology and a decrease in usage costs, there has been exponential growth in the number of subscribers to CDMA communication services. Accordingly, many methods have been proposed for meeting subscribers' ever-increasing demands for high quality CDMA service. For example, several methods for improving the forward link structure in CDMA communication system have been proposed.

One such method for improving the forward link structure, especially the forward link fundamental channel designed for the third generation multicarrier CDMA system, was proposed in the TIA/EIA TR45.5 conference and approved on May 15, 1998 by the Telecommunications Industry Association (TIA). A forward link structure for a multicarrier CDMA communication system is illustrated in FIG. 1.

With reference to FIG. 1, a channel encoder 10 encodes input data, and a rate matcher 20 repeats and punctures symbols outputted from the channel encoder 10. Here, the data input to the channel encoder 10 has a variable bit rate. The rate matcher 20 repeats and punctures the coded data bits (i.e., symbols) outputted from the channel encoder 10 in order to match the symbol rates for variable bit rate data. A channel interleaver 30 interleaves an output of the rate matcher 20. A block interleaver is typically used for the interleaver 30.

A long code generator 91 generates a long code which uniquely identifies each subscriber. A decimator 92 decimates the long code to match the rate of the long code to the rate of the symbols outputted from the interleaver 30. An adder 93 mixes an output of the channel interleaver 30 and an output of the decimator 92. An exclusive OR gate is typically used for the adder 93.

A demultiplexer 40 sequentially demultiplexes data outputted from the adder 93 to multiple carriers A, B and C. First to third signal converters 51–53 convert signal levels of binary data outputted from the demultiplexer 40 by converting input data of '0' to '+1' and input data of '1' to –'1'. First to third Walsh encoders (or orthogonal modulators) 61–63 encode data outputted from the first to third signal converters 51–53, respectively, using corresponding Walsh codes. Here, the Walsh codes have a length of 256 bits. First to third modulators 71–73 modulate outputs of the first to third Walsh encoders 61–63, respectively. Here, QPSK (Quadrature Phase Shift Keying) spreaders can be used for the modulators 71–73. First to third attenuators (or gain controllers) 81–83 control gains of the modulated signals outputted from the first to third modulators 71–73 according to corresponding attenuation signals GA–GC, respectively. Here, the signals are outputted from the first to third attenuators 81–83 with different carriers A, B and C.

In the forward link structure of FIG. 1, the channel encoder 10, having a coding rate of R=1/3, encodes a single input data bit into 3 coded data bits (i.e., code words or symbols). Such coded data bits are demultiplexed to the three carriers A, B and C after rate matching and channel interleaving. That is, the multicarrier CDMA forward link of FIG. 1 encodes and interleaves the input data and then demultiplexes the data to the three carriers before transmission.

FIG. 1 shows a multicarrier CDMA communication system. This can be modified to a single-carrier CDMA communication system by removing the demultiplexer 40 and using a signal converter, an orthogonal modulator, a spreader and an attenuator for single carrier.

FIG. 2 is a detailed diagram illustrating the channel encoder 10, the rate matcher 20 and the channel interleaver 30. In FIG. 2, data at the first rate is composed of 172 bits (full rate) per 20 ms frame; data at the second rate is composed of 80 bits (1/2 rate) per 20 ms frame; data at the third rate is composed of 40 bits (1/4 rate) per 20 ms frame; and data at the fourth rate is composed of 16 bits (1/8 rate) per 20 ms frame.

First to fourth CRC (Cyclic Redundancy Code or Cyclic Redundancy Check) generators 111–114 generate CRC bits corresponding to the respective input data having different rates and add the generated CRC bits to the input data. Specifically, a 12-bit CRC is added to the 172-bit data of the first rate; an 8-bit CRC is added to the 80-bit data of the second rate; a 6-bit CRC is added to the 40-bit data of the third rate; and a 6-bit CRC is added to the 16-bit data of the fourth rate. First to fourth tail bit generators 121–124 add 8 tail bits to the CRC-added data, respectively. Therefore, the first tail bit generator 121 outputs 192 bits; the second tail bit generator 122 outputs 96 bits; the third tail bit generator 123 outputs 54 bits; and the fourth tail bit generator 124 outputs 30 bits.

First to fourth encoders 11–14 encode data output from the first to fourth tail bit generators 121–124, respectively. A convolutional encoder having a constraint length of K=9 and a coding rate of R=1/3 can be used for the encoders 11–14. In this case, the first encoder 11 encodes the 192-bit data output from the first tail bit generator 121 into 576 symbols at the full rate; the second encoder 12 encodes the 96-bit data output from the second tail bit generator 122 into 288 symbols at 1/2 rate; the third encoder 13 encodes the 54-bit data output from the third tail bit generator 123 into 162 symbols at about 1/4 rate; and the fourth encoder 14 encodes the 30-bit data output from the fourth tail bit generator 124 into 90 symbols at about 1/8 rate.

The rate matcher 20 includes repeaters 22–24 and symbol deletion devices 27–28. The repeaters 22–24 repeat symbols outputted from the second to fourth encoders 12–14 at predetermined times in order to increase output symbol rates to the full rate of 576 symbols (or bits). For instance, since the second encoder 12 outputs 288 symbols (=1/2 the 576 symbols outputted from the first encoder 11), the second repeater 22 repeats the received 288 symbols two times to output 576 symbols. The "second repeater" means that it is the repeater for the second rate (1/2 rate); there is no first repeater. The same numbering system is used for the symbol deletion devices. The symbol deletion devices 27 and 28 delete extra symbols outputted from the repeaters 23 and 24 in order to match the number of symbols at the full rate (i.e., 576). For instance, since the third encoder 13 outputs 162 symbols (>1/4 the 576 symbols outputted from the first encoder 11), the third repeater 23 repeats the received 162 symbols four times to output 648 symbols which exceeds the full rate of 576 symbols. In order to match the symbol rate to the full rate, the third symbol deletion device 27 deletes every ninth symbol of the 648 symbols to output the full rate of 576 symbols. In addition, since the fourth encoder 14 outputs 90 symbols (>1/8 the 576 symbols output from the first encoder 11), the fourth repeater 24 repeats the received 90 symbols eight times to output 720 symbols which exceeds the full rate of 576 symbol. To match the symbol rate to the full rate, the fourth symbol deletion device 28 deletes every fifth symbol of the 720 symbols to output the full rate of 576 symbols.

First to fourth channel interleavers 31–34 interleave the symbols of full rate outputted from the first encoder 11, the second repeater 22, the symbol deletion device 27 and the symbol deletion device 28, respectively. As illustrated in FIG. 2, symbol repetition is applied only to the symbols of non-full rate. Here, the carriers A, B and C each have a bandwidth of 1.2288 MHz (about 1.25 MHz), and the whole bandwidth of the three carriers is equal to three IS-95 channel bandwidths. Therefore, the three carriers A, B and C have a bandwidth of 3.6864 MHz in total, which is about 5 MHz. Forward Error Correction (FEC) is used to maintain a sufficiently low Bit Error Rate (BER) for a mobile station channel having a low signal-to-noise ratio (SNR) by providing a channel coding gain. The forward link for the multicarrier communication system can share the same frequency band with the forward link for the IS-95 system by using an overlay method. However, the overlay method provides the following problems.

In the overlay method, three forward link carriers for the multicarrier system are overlaid on three 1.25 MHz bands used in the IS-95 CDMA system. FIG. 3 illustrates the transmission power levels, by the respective bands, of base stations for the IS-95 system and the multicarrier system. In the overlay method, since the frequency bands for the multicarrier-system are overlaid on the frequency bands for the IS-95 system, the transmission power or channel capacity is shared between the IS-95 base station and the multicarrier base station at the same frequency band. This means there are two different base stations. In other words, there is an IS-95 base station and an IMT-2000 base station. In the case where the transmission power is shared between the two systems, the transmission power is first allocated for the IS-95 channel which mainly supports a voice service and then, the maximum transmission power permissible to the respective carriers for the multicarrier CDMA system is determined. However, the maximum transmission power cannot exceed a predetermined power level, because the base station has limited transmission power. Further, when the base station transmits data to many subscribers increasing interference among the subscribers results in an increase in noise. FIG. 3 illustrates the state where the IS-95 base station and the multicarrier base station allocate substantially equal transmission power at the respective 1.25 MHz frequency bands.

However, the IS-95 channels of 1.25 MHz frequency bands have a different transmission power according to a change in the number of subscribers in service and a change in voice activity of the subscribers. FIGS. 4 and 5 illustrate situations where the transmission power allocated for the multicarrier base station decreases at some carrier frequencies, because the transmission power allocated for the IS-95 base station has increased rapidly at those frequency bands due to an increase in the number of IS-95 subscribers. As a result, sufficient transmission power cannot be allocated for one or more of the multiple carriers so the SNRs are different for the respective carriers at the receiver. Accordingly, a signal received at a carrier having the low SNR increases in the bit error rate (BER). That is, when the number of IS-95 subscribers increases and the voice activity is relatively high, the signal transmitted via a carrier overlaid on the corresponding busy frequency band increases in BER, resulting in a decreased system capacity and an increased interference among the IS-95 subscribers. That is, the overlay method may cause capacity reduction in the multicarrier system and an increase in interference among the IS-95 subscribers.

In the multicarrier system, the respective carriers may have independent transmission powers as illustrated in FIGS. 4 and 5. With respect to performance, because only two of the three carriers have sufficient power, FIG. 4 shows a power distribution similar to the case where a R=1/2 channel encoder is used; and, because only one of the three carriers has sufficient power, FIG. 5 shows the power distribution being worse than the case where a channel encoder is not used. In these cases, one or two of the three coded bits (i.e., symbols) for an input data bit may not be transmitted, causing a degradation in system performance.

Therefore, even in a DS-CDMA communication system using a single carrier, weight distribution of the symbols generated by channel encoding is poor, thereby causing a degradation in channel decoding performance. This invention is not limited to DS-CDMA and multicarrier CDMA systems.

SUMMARY OF THE INVENTION

It is, therefore, an object of the present invention to provide a channel coding device and method for generating coded data bits having a good channel decoding performance in a DS-CDMA communication system.

It is another object of the present invention to provide a R=1/6 convolutional encoding device and method for increasing a channel performance in a channel transmitter of a DS-CDMA communication system.

To achieve the above objects, there is provided a communication device for a direct sequence code division multiple access (DS-CDMA) communication system. The communication device comprises a CRC (Cyclic Redundancy Code) generator for generating CRC bits according to input data bits and adding the generated CRC bits to the input data bits; a channel encoder for encoding the CRC-added data bits preferably using a coding rate R=1/6 convolutional code of a generator polynomial of (457, 755, 551, 637, 523, 727); and an interleaver for interleaving the coded data bits.

The channel encoder comprises a plurality of delays for delaying the input data bits to output first to eighth delayed data bits; a first operator for exclusively ORing the input data bits and the third, fifth, sixth, seventh and eighth delayed data bits to generate a first symbol; a second operator for exclusively ORing the input data bits and the first, second, third, fifth, sixth and eighth delayed data bits to generate a second symbol; a third operator for exclusively ORing the input data bits and the second, third, fifth and eighth delayed data bits to generate a third symbol; a fourth operator for exclusively ORing the input data bits and the first, fourth, fifth, sixth, seventh and eighth delayed data bits to generate a fourth symbol; a fifth operator for exclusively ORing the input data bits and the first, fourth, sixth and eighth delayed data bits to generate a fifth symbol; and a sixth operator for exclusively ORing the input data bits and the first, second, fourth, sixth, seventh and eighth delayed data bits to generate a sixth symbol.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Figure 1:
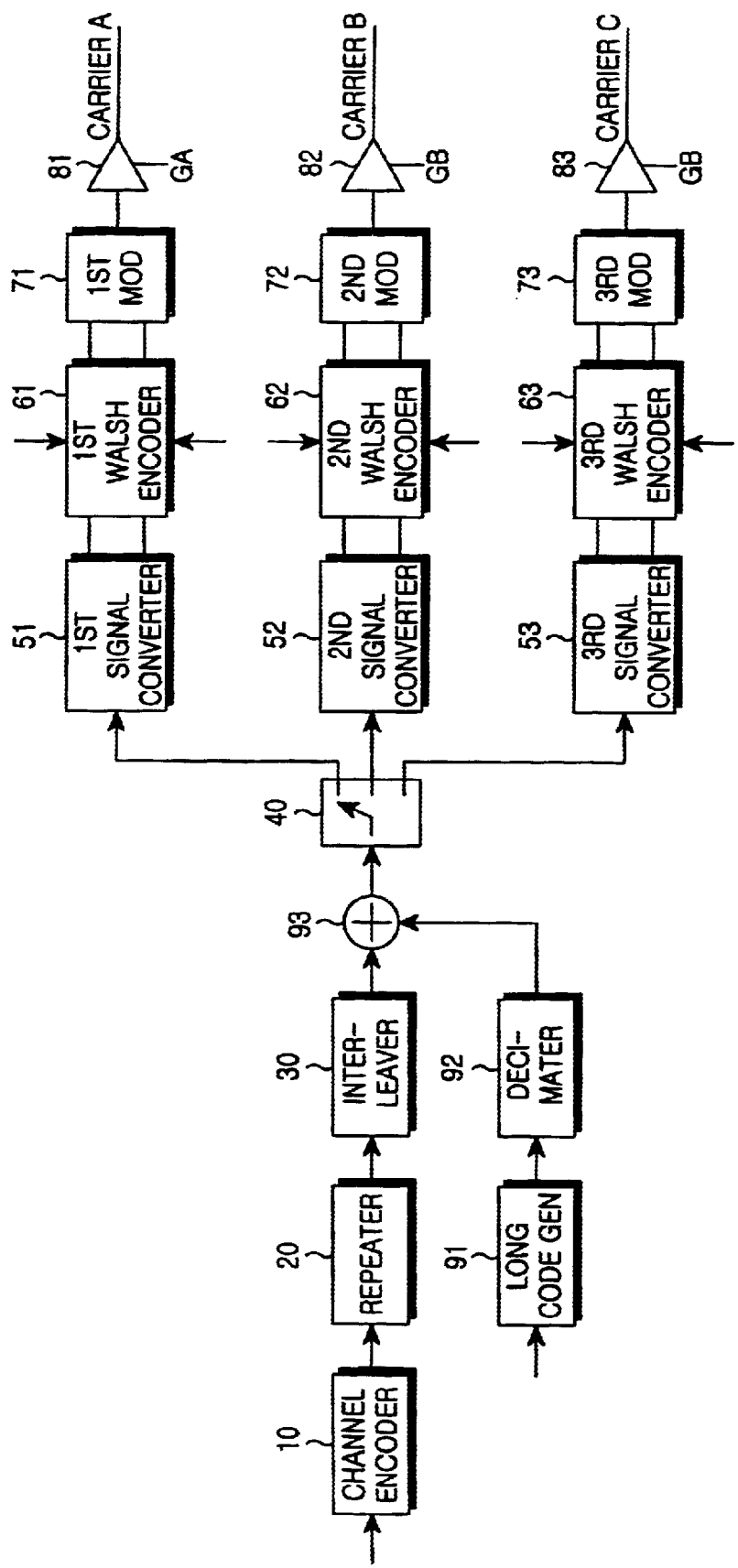
FIG. 1 a block diagram of a forward link structure for a conventional multicarrier CDMA communication system.
Figure 2:
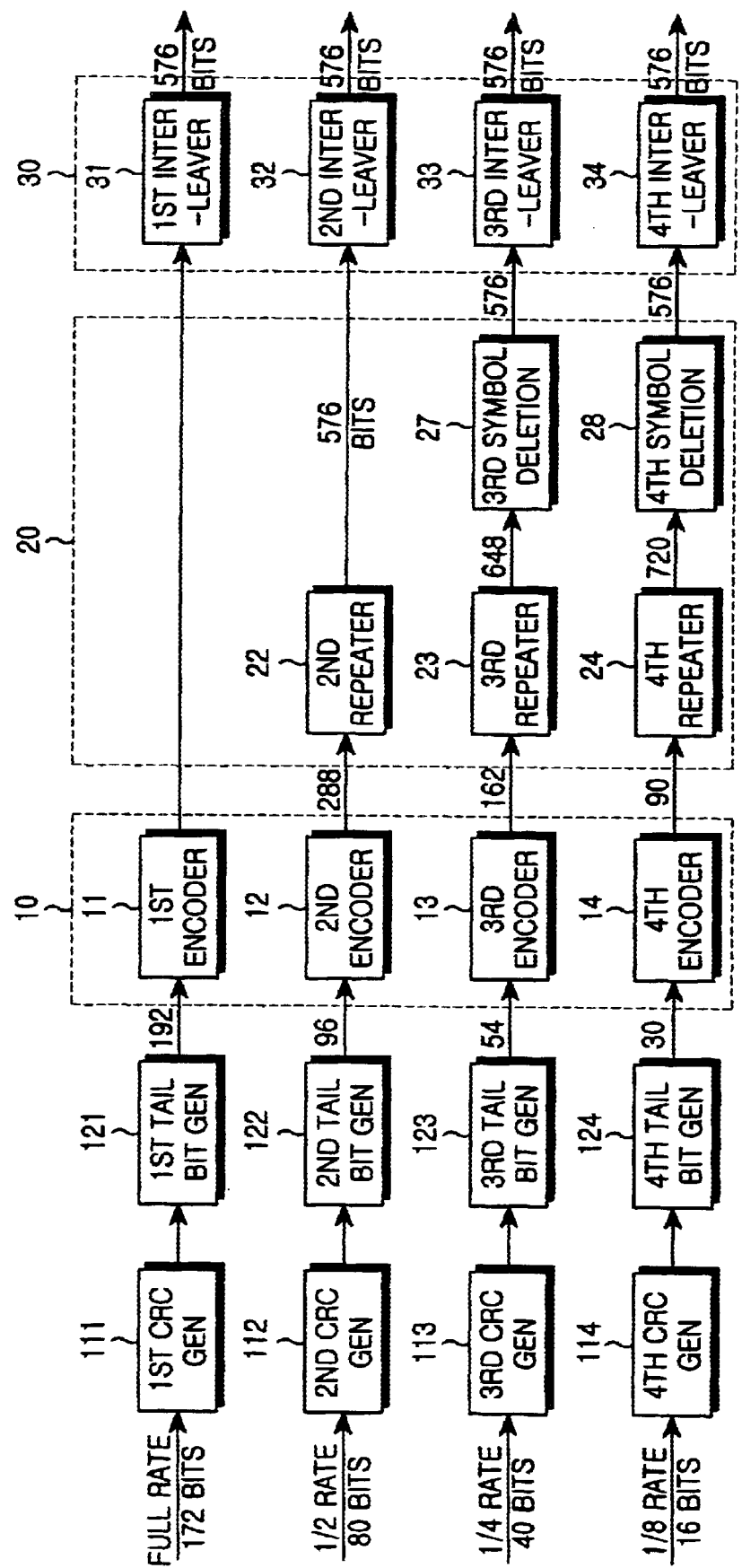
FIG. 2 is a detailed block diagram illustrating a fundamental channel structure for the forward link structure of FIG. 1.
Figure 3:
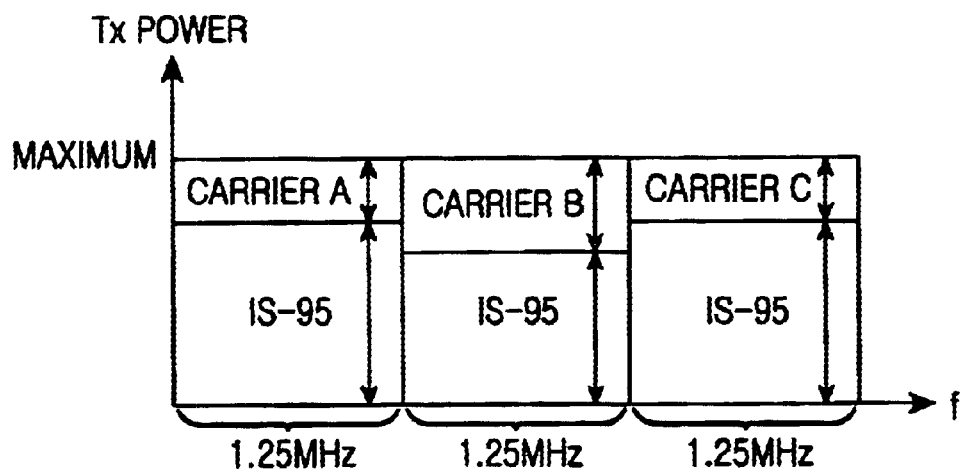
FIG. 3 is a diagram illustrating transmission power distribution of IS-95 channel bands and multicarrier channel bands in a state where the multicarrier channel bands are overlaid on the IS-95 channel bands at the same frequency bands in the multicarrier CDMA system of FIG. 1.
Figure 4:
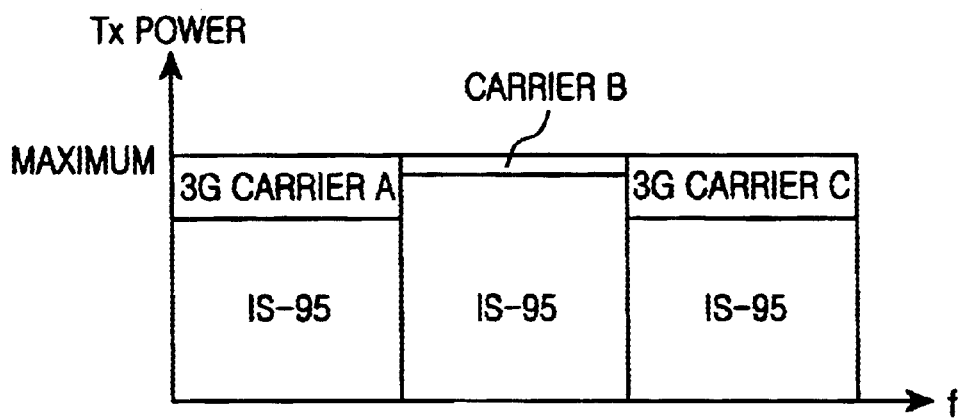
FIG. 4 is a diagram illustrating a state where the transmission power of one multiple carrier is decreased when the transmission power for the corresponding IS-95 channel is increased, due to the limited transmission power or capacity in the CDMA system of FIG. 1.
Figure 5:
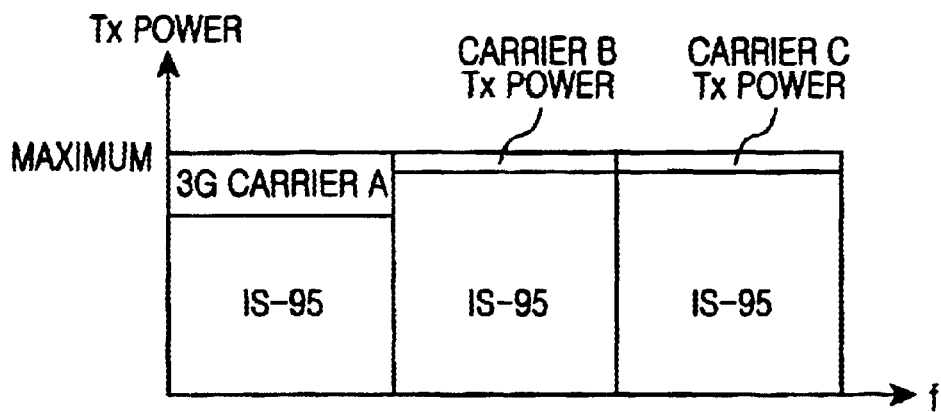
FIG. 5 is a diagram illustrating a state where the transmission power of two multiple carriers decreases when transmission power for the corresponding IS-95 channels are increased, due to the limited transmission power or capacity in the CDMA system of FIG. 1.

A preferred embodiment of the present invention will be described herein below with reference to the accompanying drawings. In the following description, well-known functions or constructions are not described in detail since they would obscure the invention in unnecessary detail.

The word "symbol" as used herein refers to a coded data bit outputted from an encoder. For convenience of explanation, it is assumed that the multicarrier communication system is a three-carrier CDMA communication system. It is contemplated that the present invention can be embodied in other types of communication systems, such as a Time Division Multiple Access (TDMA) system.

The present invention provides a device and method for improving system performance in a communication system supporting both the IS-95 system and the multicarrier system, wherein transmission signals of the two different systems are overlaid at the same frequency bands. In the present device and method, the coded symbols are distributed such that performance degradation is minimized during decoding of the damaged symbols, and then the distributed coded bits are assigned to the respective carriers. Thus, even if one or more of the carriers has interference during reception, it is possible to perform decoding on only the coded bits received via the other carriers, thereby improving system performance.

In such a system where a channel encoder uses the R=1/6 convolutional codes, R=1/6 convolutional codes having as good a performance as both R=1/2 and R=1/4 convolutional codes are required in order to minimize performance degradation. The R=1/6 convolutional codes output 6 coded symbols for each single input information bit. In the multicarrier system, even when 4 of the symbols are transmitted over a channel lacking transmission power and only 2 of them are normally transmitted (this is equivalent to the case where R=1/2 convolutional codes are used), the 1/6 convolutional codes should have as good a performance as R=1/2 convolutional codes. Further, even when 2 of the symbols are transmitted over a channel lacking transmission power and only 4 of them are normally transmitted (this is equivalent to the case where R=1/4 convolutional codes are used), the 1/6 convolutional codes should have as good a performance as R=1/4 convolutional codes.

Therefore, in order to determine the R=1/6 convolutional codes proper for this situation, it is necessary to first determine the R=1/2 convolutional codes having a good performance. Then, by grouping the determined R=1/2 convolutional codes by 3 convolutional codes and selecting the groups having the good performance, it is possible to generate the R=1/6 convolutional codes having a good performance as both the R=1/2 convolutional codes and the R=1/4 convolutional codes.

Actually, however, it is very difficult to determine the R=1/6 convolutional codes having good performance. For the constraint length K=9, the number of polynomials of the $8^{th}$ degree is $2^9$, and for 6 pairs of R=1/6 convolutional codes, the number of polynomials of the $8_{th}$ degree is $(2^9)^6=2^{54}$. It is very difficult to determine the R=1/6 convolutional codes having the good performance out of the $2^{54}$ polynomials. Therefore, the above R=1/6 convolutional codes determined taking the multicarrier system into consideration will have good performance even in a direct sequence spreading system with a single carrier.

In the forward link of the CDMA communication system, a coding rate R=1/6 convolutional encoder can be used for the channel encoder. However, it is very difficult to find R=1/6 convolutional codes having good decoding performance. Therefore, the present invention provides a method for generating R=1/6 convolutional codes having good decoding performance and distributing (or demultiplexing) the generated R=1/6 convolutional codes to the multiple carriers in a DS-CDMA communication system. The generated R=1/6 convolutional codes have good decoding performance in both the multicarrier CDMA communication system and the single carrier DS-CDMA communication system.

A description will now be made of a method for generating symbols so as to optimize the channel performance (capability) and distributing the generated symbols in the multicarrier CDMA communication system.

Figure 6:
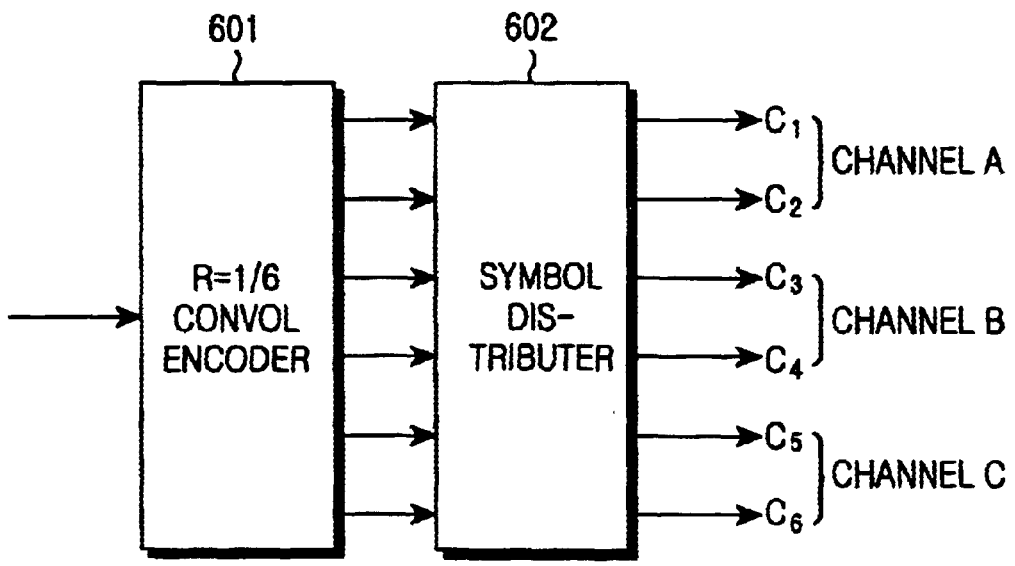
FIG. 6 is a block diagram of a channel encoder and a symbol distributor for generating R=1/6 convolutional codes according to an embodiment of the present invention.

First, reference will be made to R=1/6 convolutional codes for a 3-carrier CDMA communication system. FIG. 6 illustrates a convolutional encoder 601 and a symbol distributor 602 according to an embodiment of the present invention. The convolutional encoder 601 encodes one input data bit into six symbols which are allocated to three carriers A, B and C. For symbol allocation, the symbol distributor 602 uniformly distributes the six input bits to the three carriers by two bits (or symbols) per carrier. The symbol distributor 602 distributes the symbols outputted from the convolutional encoder 601, taking into consideration how many carriers are disabled out of the three carriers. By using this symbol distribution method, even though one or two of the three carriers are disabled, performance degradation in channel decoding is minimized.

A description will now be made regarding a method for designing the symbol distributor 602. The bit error rate (BER) value depends primarily on the number of damaged symbols. Even though the received coded symbols are damaged, the symbols located at a frame are uniformly distributed to the carriers by the distributor 602. Therefore system degradation can be reduced. Accordingly, even though the symbols for a certain channel are all damaged, an increase in the BER value can be minimized after channel decoding by distributing the non-damaged symbols (or the damaged symbols which are the least likely to degrade system performance) to the carriers.

In addition, during transmission, the symbols outputted from a component encoder in the channel encoder are distributed to the carriers; during decoding, a component decoder in a channel decoder is selected such that the BER can be low, even though the symbols on a certain carrier are all damaged.

Selection of the component encoder in the channel encoder will now be described. First, reference will be made to a convolutional code having a constraint length K=9 and a rate R=1/3. In the following description, generator polynomials $g_i$ are expressed in octal form. The K=9, R=1/3 convolutional code has a free distance of $d_{free}$=18. It is noted that there exist 5685 sets when a search is made for convolutional codes having K=9, R=1/3 and $d_{free}$=18, by changing generator polynomials $g_1$, $g_2$ and $g_3$. Only non-catastrophic codes are selected. In addition, it is necessary to prevent performance degradation, even though a certain carrier is damaged, when selecting convolutional codes to be provided to the multicarrier system. Accordingly, it is preferable to maximize the free distance value.

As a reference code for performance comparison, a convolutional code of $(g_1, g_2, g_3)$=(557, 663, 711) is used, which is the same code used in the IS-95 system. In the IS-95 system, a free distance of the convolutional code is $d_{free}$=18, and free distances between component codes are $d_{free}(g_{557}, g_{663})$=9, $d_{free}(g_{557}, g_{711})$=11, and $d_{free}(g_{663}, g_{711})$=10. Further, the performance of a convolutional code can be predicted using the BER upper limit formula, which is determined by the transfer function. For the IS-95 system, the transfer function of the convolutional code is $T(D,I)|_{I=1}=5D^{18}+7D^{20}+O(D^{21})$, and the BER upper limit formula is $(\partial/\partial I)T(D,I)|_{I=1}=11D^{18}+32D^{20}+O(D^{21})$.

When the convolutional code for the IS-95 system is viewed in light of a component code, catastrophic error propagation occurs at the combination of generator polynomials $g_1$ and $g_2$. Therefore, when the convolutional codes for the IS-95 system are used for the multicarrier system, it is necessary to properly use interleaving and puncturing. Since the IS-95 convolutional codes cause catastrophic error propagation, it is necessary to find new convolutional codes suitable for the multicarrier system. It is found from a complete computer search that there is no convolutional code for which a free distance between component codes is always 12. Therefore, convolutional codes having the free distance of $d_{free}(g_i,g_j) \geq 11$ are used, and there are only eight which satisfy that criteria. Here, not only the convolutional codes, but also the component codes are non-catastrophic. Since the first term of the BER upper limit formula is most influential, first and eighth convolutional codes are considered to be the most optimal codes. Further, since the pairs of first and eighth convolutional codes; second and seventh codes; third and fourth codes; and fifth and sixth codes have a reciprocal relation, they are essentially the same codes. Therefore, only four convolutional codes exist.

Table 1 below provides characteristics of a K=9, R=1/3 convolutional encoder.

TABLE 1

| No | | Generator Polynomial | Remarks |
|---|---|---|---|
| 1 | 467 | Free Distance between Component Codes | $d_{12}$ = 11, $d_{13}$ = 11, $d_{23}$ = 12 |
| | 543 | Transfer Function, $T(D,I)|_{I=1}$ | $4D^{18} + 12D^{20} + O(D^{21})$ |
| | 765 | BER Upper Limit Formula | $9D^{18} + 54D^{20} + O(D^{21})$ |
| 2 | 547 | Free Distance between Component Codes | $d_{12}$ = 11, $d_{13}$= 11, $d_{23}$ = 12 |
| | 643 | Transfer Function, $T(D,I)|_{I=1}$ | $6D^{18} + 9D^{20} + O(D^{21})$ |
| | 765 | BER Upper Limit Formula | $19D^{18} + 33D^{20} + O(D^{21})$ |

TABLE 1-continued

| No | | Generator Polynomial | Remarks |
|---|---|---|---|
| 3 | 453 | Free Distance between Component Codes | $d_{12} = 11, d_{13} = 12, d_{23} = 11$ |
|   | 665 | Transfer Function, $T(D,I)|_{I=1}$ | $5D^{18} + 7D^{20} + O(D^{21})$ |
|   | 771 | BER Upper Limit Formula | $13D^{18} + 31D^{20} + O(D^{21})$ |
| 4 | 477 | Free Distance between Component Codes | $d_{12} = 11, d_{13} = 12, d_{23} = 11$ |
|   | 533 | Transfer Function, $T(D,I)|_{I=1}$ | $5D^{18} + 7D^{20} + O(D^{21})$ |
|   | 651 | BER Upper Limit Formula | $13D^{18} + 31D^{20} + O(D^{21})$ |
| 5 | 561 | Free Distance between Component Codes | $d_{12} = 11, d_{13} = 12, d_{23} = 11$ |
|   | 647 | Transfer Function, $T(D,I)|_{I=1}$ | $5D^{18} + 7D^{20} + O(D^{21})$ |
|   | 753 | BER Upper Limit Formula | $13D^{18} + 31D^{20} + O(D^{21})$ |
| 6 | 435 | Free Distance between Component Codes | $d_{12} = 12, d_{13} = 11, d_{23} = 11$ |
|   | 657 | Transfer Function, $T(D,I)|_{I=1}$ | $5D^{18} + 7D^{20} + O(D^{21})$ |
|   | 713 | BER Upper Limit Formula | $13D^{18} + 31D^{20} + O(D^{21})$ |
| 7 | 537 | Free Distance between Component Codes | $d_{12} = 12, d_{13} = 11, d_{23} = 11$ |
|   | 613 | Transfer Function, $T(D,I)|_{I=1}$ | $6D^{18} + 9D^{20} + O(D^{21})$ |
|   | 715 | BER Upper Limit Formula | $19D^{18} + 33D^{20} + O(D^{21})$ |
| 8 | 537 | Free Distance between Component Codes | $d_{12} = 12, d_{13} = 11, d_{23} = 11$ |
|   | 615 | Transfer Function, $T(D,I)|_{I=1}$ | $4D^{18} + 12D^{20} + O(D^{21})$ |
|   | 731 | BER Upper Limit Formula | $9D^{18} + 54D^{20} + O(D^{21})$ |

In Table 1, the first term $d_{12}$ means $d_{(467,543)}$ (the free distance between the first and second component codes), and hereinafter is used to provide the same meaning. Comparing these codes with the IS-95 codes in light of the first term of the BER upper limit formula, the first and eighth codes are superior in performance to the IS-95 codes, the third, fourth, fifth and sixth codes are similar in performance to the IS-95 codes and the second and seventh codes are inferior in performance to the IS-95 codes. Therefore, it is preferable to use the eighth (or first) code.

Figure 10:
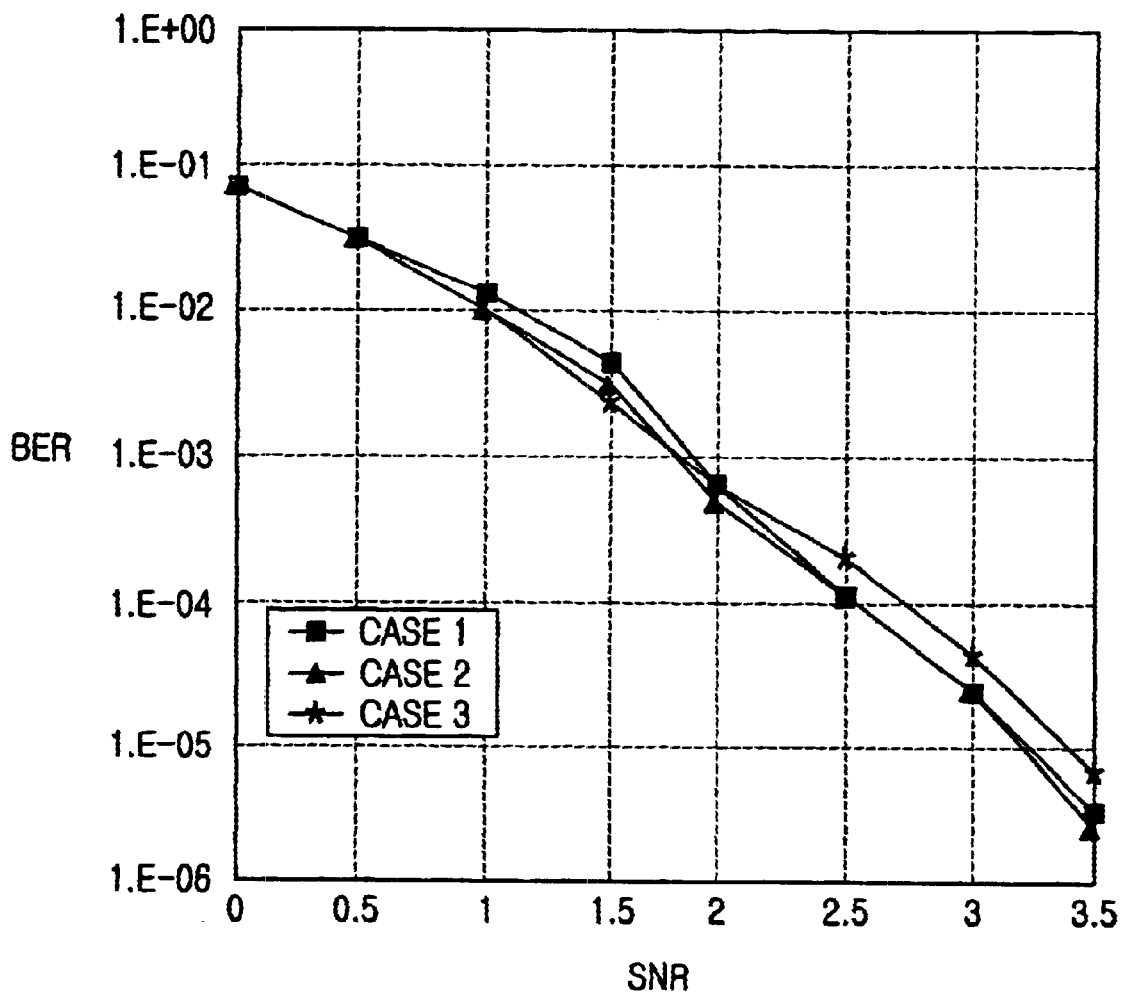
FIG. 10 is a chart providing a performance comparison among R=1/3 convolutional codes.
Figure 11:
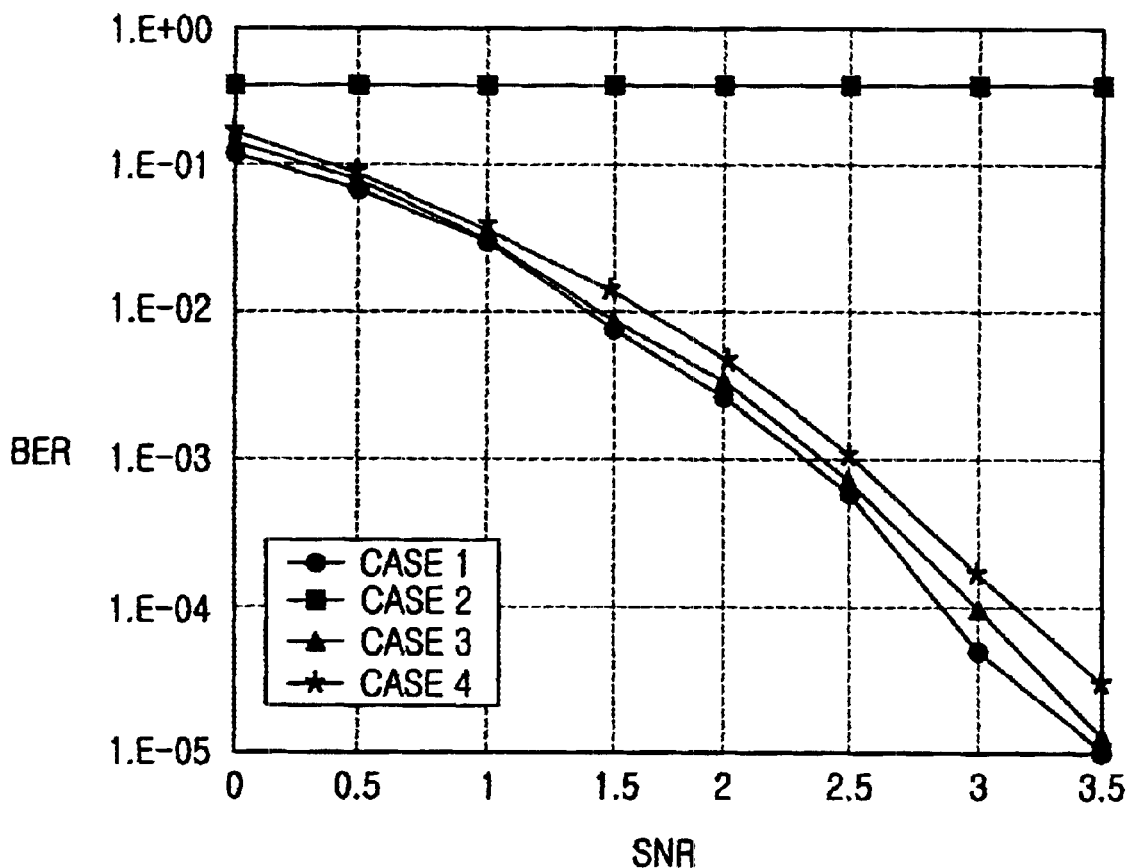
FIG. 11 is a chart illustrating a worst performance comparison among R=1/2 convolutional codes using generator polynomials of a convolutional encoder having a coding rate of R=1/3.
Figure 12:
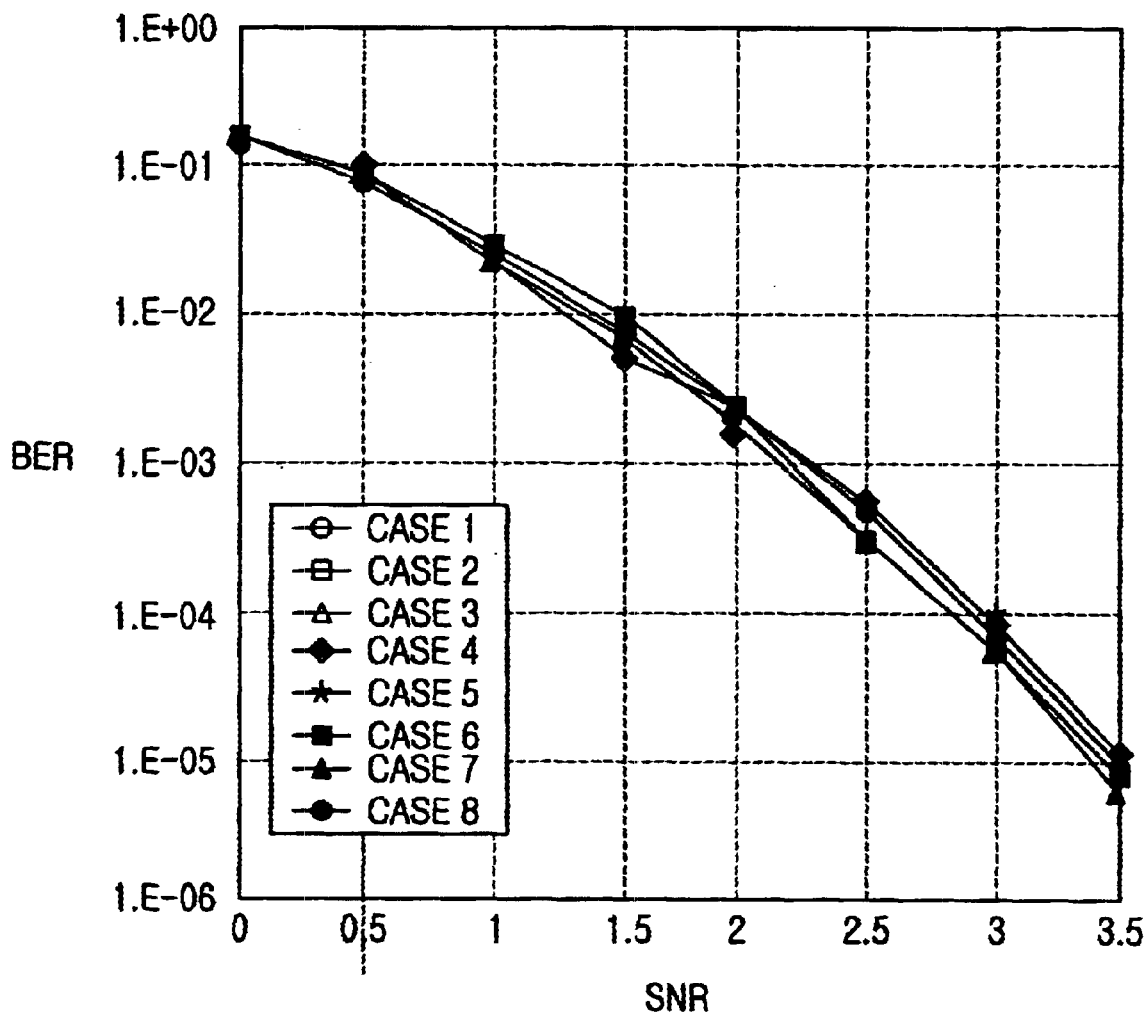
FIG. 12 is a chart illustrating a performance comparison among R=1/2 component codes for an R=1/6 convolutional code.
Figure 13:
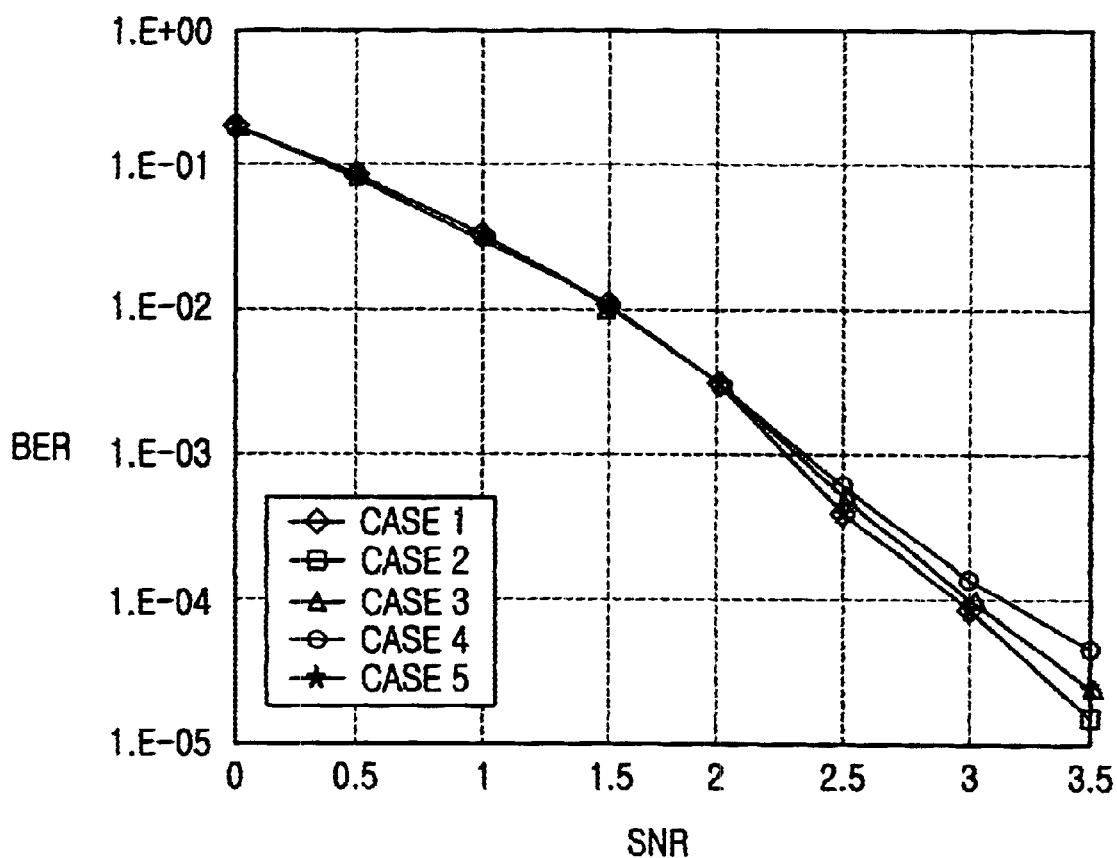
FIG. 13 is a chart illustrating a worst performance comparison among R=1/2 component codes using an R=1/6 convolutional encoder having a good performance.

In the meantime, there exist four or more codes whose free distances among the component codes are 12, 12 and 10; among these codes, a generator polynomial for a superior code in the light of the first term of the BER upper limit formula is $(g_1, g_2, g_3) = (515, 567, 677)$. Shown in FIG. 10 is the simulation result for performances of the R=1/3 convolutional code in a AWGN (Additive White Gaussian Noise) environment in the case where the 3-carrier system has an optimal performance without damaging symbols of the respective carriers. In the following descriptions, the simulations of FIGS. 11–13 are all performed in the AWGN environment. <Case 1> below represents a R=1/3 convolutional code for an IS-95 system, and <Case 2> and <Case 3> below represent a R=1/3 convolutional code searched using the inventive method.

(IS-95)$g_1$=557, $g_2$=663, $g_3$=711→$d_{free}$=18  <Case 1>

$g_1$=731, $g_2$=615, $g_3$=537→$d_{free}$=18 $d_{free}(g_1,g_2)$=11, $d_{free}(g_1,g_3)$=11, $d_{free}(g_2,g_3)$=12  <Case 2>

$g_1$=515, $g_2$=567, $g_3$=677→$d_{free}$=18 $d_{free}(g_1,g_2)$=11, $d_{free}(g_1,g_3)$=12, $d_{free}(g_2,g_3)$=10  <Case 3>

A description will now be made regarding the case where the R=1/3 convolutional code is applied to the three-carrier system and a certain one of the three carriers is damaged (or lost). Although the original coding rate is 1/3, the loss of one carrier causes the coding rate to be equal to 1/2. Therefore, shown in FIG. 11 is the simulation results for the R=1/2 convolutional codes using the generator polynomials for the 1/3 convolutional codes. In FIG. 11, the respective conditions can be explained by <Case 1> through <Case 4> below. FIG. 11 illustrates the worst performance graph for the R=1/2 convolutional codes using the generator polynomials for the R=1/3 convolutional code.

<Case 1> optimal R=1/2 convolutional code→$g_1$=561, $g_2$=753, $d_{free}(g_1,g_2)$=12.

<Case 2> the worst performance, $g_1$=557, $g_2$=711 out of three R=1/2 convolutional codes using the generator polynomial (557, 663, 711) for a 1/3 convolutional code used for the IS-95 system→catastrophic error propagation occurs.

<Case 3> the worst performance, $g_1$=731, $g_2$=615 ($d_{free}(g_1,g_2)$=11) for R=1/2 convolutional code using the generator polynomial (731, 615, 537) for a R=1/3 convolutional code.

<Case 4> the worst performance, $g_1$=567, $g_2$=677 ($d_{free}(g_1,g_2)$=10) for R=1/2 convolutional code using the generator polynomial (515, 567, 677) for a R=1/3 convolutional code.

When one carrier is damaged in a three-carrier system using the R=1/3 convolutional codes, the coding rate becomes equal to R=1/2. In this case, the symbol distribution method for the symbol distributor is found by appropriately distributing the original R=1/3 convolutional codes to the three carriers using the symbol deleting matrixes shown below to minimize performance degradation even though the coding rate becomes R=1/2. This is done on the transmitting side. In the simplest method, the two symbol deleting matrixes shown below are generated. In the symbol deleting matrixes, '0' means the case where a carrier to which the corresponding symbol is provided is damaged, and '1' means the case where the carrier to which the corresponding symbol is provided is not damaged. This means that the symbols corresponding to '0' are all allocated to a certain carrier which is damaged during transmission. Therefore, one of the following various patterns of the symbol deleting matrix is selected which minimizes performance degradation even though one carrier is damaged, and the symbol distributor 602 provides the symbols to the respective carriers using the selected pattern. The following symbol deleting matrixes are used for finding a pattern to be used by the symbol distributor 602 to correctly allocate the symbols to the respective carriers.

$$D_1 = \begin{bmatrix} 0 & 1 & 1 \\ 1 & 0 & 1 \\ 1 & 1 & 0 \end{bmatrix}$$

-continued $$D_2 = \begin{bmatrix} 1 & 1 & 0 \\ 1 & 0 & 1 \\ 0 & 1 & 1 \end{bmatrix}$$

Further, an m-sequence having an 8-bit length is generated on a two-stage Galois field GF(3) using an m-sequence. For a ninth convolutional code, a sequence {1,2,0,2,2,1,0,1,2} is generated and then, the following symbol deleting matrix $D_3$ is generated using the sequence.

$$D_3 = \begin{bmatrix} 1 & 1 & 0 & 1 & 1 & 1 & 0 & 1 & 1 \\ 0 & 1 & 1 & 1 & 1 & 0 & 1 & 0 & 1 \\ 1 & 0 & 1 & 0 & 0 & 1 & 1 & 1 & 0 \end{bmatrix}$$

Further, the following symbol deleting matrixes $D_4$ and $D_5$ are generated by changing the rows of the symbol deleting matrix $D_3$.

$$D_4 = \begin{bmatrix} 1 & 0 & 1 & 0 & 0 & 1 & 1 & 1 & 0 \\ 1 & 1 & 0 & 1 & 1 & 1 & 0 & 1 & 1 \\ 0 & 1 & 1 & 1 & 1 & 0 & 1 & 0 & 1 \end{bmatrix}$$

$$D_5 = \begin{bmatrix} 0 & 1 & 1 & 1 & 1 & 0 & 1 & 0 & 1 \\ 1 & 0 & 1 & 0 & 0 & 1 & 1 & 1 & 0 \\ 1 & 1 & 0 & 1 & 1 & 1 & 0 & 1 & 1 \end{bmatrix}$$

In addition a, sequence {2,1,0,1,1,0,1,2,1,0,0,0,2,1,2} is obtained by generating 15 random numbers over GF(3) using a random number, and the following symbol deleting matrix $D_6$ is created using the above sequence.

$$D_6 = \begin{bmatrix} 1 & 1 & 0 & 1 & 1 & 0 & 1 & 1 & 0 & 0 & 0 & 1 & 1 & 1 \\ 1 & 0 & 1 & 0 & 0 & 1 & 0 & 1 & 0 & 1 & 1 & 1 & 1 & 0 & 1 \\ 0 & 1 & 1 & 1 & 1 & 1 & 1 & 0 & 1 & 1 & 1 & 1 & 0 & 1 & 0 \end{bmatrix}$$

Also, the following symbol deleting matrixes $D_7$ and $D_8$ are generated by changing the rows as in the method using the m-sequence.

$$D_7 = \begin{bmatrix} 0 & 1 & 1 & 1 & 1 & 1 & 1 & 0 & 1 & 1 & 1 & 0 & 1 & 0 \\ 1 & 1 & 0 & 1 & 1 & 0 & 1 & 1 & 1 & 0 & 0 & 0 & 1 & 1 & 1 \\ 1 & 0 & 1 & 0 & 0 & 1 & 0 & 1 & 0 & 1 & 1 & 1 & 1 & 0 & 1 \end{bmatrix}$$

$$D_8 = \begin{bmatrix} 1 & 0 & 1 & 0 & 0 & 1 & 0 & 1 & 0 & 1 & 1 & 1 & 1 & 0 & 1 \\ 0 & 1 & 1 & 1 & 1 & 1 & 1 & 0 & 1 & 1 & 1 & 0 & 1 & 0 \\ 1 & 1 & 0 & 1 & 1 & 0 & 1 & 1 & 1 & 0 & 0 & 0 & 1 & 1 & 1 \end{bmatrix}$$

Next, a description will be made regarding a convolutional code having a symbol rate of 1/6. A K=9, R=1/6 convolutional code has a free distance of $d_{free}$=37. When searching for the convolutional codes having a free distance of $d_{free}$=37 by randomly changing the generator polynomials $g_1, g_2, \ldots g_6$, the following conditions should be satisfied.

First, it should be a R=1/6 convolutional code with a good decoding performance.

Second, it should be a R=1/4 convolutional code with a good decoding performance which has generator polynomials $(g_1,g_2,g_3,g_4)$, $(g_1,g_2,g_5, g_6)$ and $(g_3,g_4,g_5,g_6)$, considering the case that one of three carriers is damaged in the three-carrier system.

Third, it should be a 1/2 convolutional code with a good decoding performance which has generator polynomials $(g_1,g_2)$, $(g_3,g_4)$ and $(g_5,g_6)$, considering the case that two of three carriers are damaged in the three-carrier system.

With respect to the second and third conditions, performance degradation is minimized even though one or two of the three carriers are completely disabled, providing for the multicarrier system in which six output bits of the convolutional code are allocated to three carriers by two bits. From this point of view, it is preferable that the R=1/4 convolutional code and the R=1/2 convolutional code have the maximum free distance.

A method of searching for a R=1/2 convolutional code satisfying the third condition becomes apparent from the following description. There exist 35 non-catastrophic convolutional codes with R=1/2, K=9 and $d_{free}$=12. An upper limit formula for the BER is given as follows (a coefficient $c_{12}$ of the most important term $D^{12}$ in determining the BER ranges from 33 to 123):

$$(\partial/\partial I)T(D,I)|_{I=1}=c_{12}D^{12}+c_{13}D^{13+}\cdots$$

First, for the R=1/6 convolutional codes, there exist 180 R=1/6 convolutional codes with $d_{free}$=37, satisfying the third condition. It is assumed that $d_{free}(g_{2i-1}, g_{2i})$=12. Here, there exist 58 convolutional codes in which the first term of the BER upper limit formula for the R=1/6 convolutional code has a coefficient of $c_{37}$=1. The following are the R=1/6 convolutional codes selected among the 58 convolutional codes after conducting a performance verification or analysis.

1) (457, 755, 551, 637, 523, 727): $c_{38}$=4 (NO=1)
2) (457, 755, 551, 637, 625, 727): $c_{38}$=4 (NO=3)
3) (457, 755, 455, 763, 625, 727): $c_{38}$=4 (NO=5)
4) (515, 677, 453, 755, 551, 717): $c_{38}$=6 (NO=7)
5) (515, 677, 453, 755, 551, 717): $c_{38}$=6 (NO=9)
6) (515, 677, 557, 651, 455, 747): $c_{38}$=6 (NO=11)
7) (457, 755, 465, 753, 551, 637): $c_{38}$=6 (NO=13)
8) (515, 677, 551, 717, 531, 657): $c_{38}$=8 (NO=27)
9) (515, 677, 455, 747, 531, 657): $c_{38}$=8 (NO=29)
10) (453, 755, 557, 751, 455, 747): $c_{38}$=10 (NO=31)
11) (545, 773, 557, 651, 551, 717): $c_{38}$=12 (NO=51)
12) (453, 755, 457, 755, 455, 747): $c_{38}$=20 (NO=57),

Here, the notation in parenthesis ( ) represents octal generation polynomial, and $c_{38}$ represents the number of code words having a weight of 38.

The following are 5 R=1/6 convolutional codes with a good decoding performance selected among the 12 performance-verified 1/6 convolutional codes.

1) (457, 755, 551, 637, 523, 727): $c_{38}$=4 (NO=1)
2) (515, 677, 453, 755, 551, 717): $c_{38}$=6 (NO=7)
3) (545, 773, 557, 651, 455, 747): $c_{38}$=6 (NO=8)
4) (515, 677, 557, 651, 455, 747): $c_{38}$=6 (NO=11)
5) (515, 677, 455, 747, 531, 657): $c_{38}$=8 (NO=29)

A performance of the R=1/2 convolutional codes using five generator polynomials for the R=1/6 convolutional code are verified, and further, a performance of the R=1/4 convolutional codes using five generator polynomials for the R=1/6 convolutional code are also verified. First, a transfer function for the R=1/2 convolutional codes will be described with reference to Table 2 in which the generator polynomials are represented by octal numbers.

TABLE 2

| No | ½ Generator Polynomial | BER Upper Limit Formula, Coeff $c_{12}, c_{13}, c_{14}$ |
|---|---|---|
| 1 | 435, 657 | (33, 0, 281) |
| 2 | 561, 753 | (33, 0, 281) |
| 3 | 151, 677 | (38, 106, 238) |
| 4 | 545, 773 | (38, 106, 238) |
| 5 | 463, 755 | (38, 0, 274) |
| 6 | 557, 631 | (38, 0, 274) |
| 7 | 557, 751 | (40, 33, 196) |
| 8 | 457, 755 | (40, 33, 196) |
| 9 | 453, 755 | (40, 0, 196) |
| 10 | 557, 651 | (40, 0, 271) |
| 11 | 471, 673 | (50, 0, 298) |
| 12 | 537, 615 | (50, 0, 360) |
| 13 | 543, 765 | (50, 0, 360) |
| 14 | 455, 747 | (50, 0, 395) |
| 15 | 551, 717 | (50, 0, 395) |
| 16 | 465, 753 | (52, 0, 287) |
| 17 | 531, 657 | (52, 0, 287) |
| 18 | 455, 763 | (52, 0, 339) |
| 19 | 551, 637 | (52, 0, 339) |
| 20 | 561, 735 | (57, 0, 355) |
| 21 | 435, 567 | (57, 0, 355) |
| 22 | 561, 755 | (57, 0, 390) |
| 23 | 435, 557 | (57, 0, 390) |
| 24 | 465, 771 | (58, 0, 321) |
| 25 | 477, 531 | (58, 0, 321) |
| 26 | 537, 613 | (67, 0, 472) |
| 27 | 643, 765 | (67, 0, 472) |
| 28 | 523, 727 | (68, 0, 349) |
| 29 | 625, 727 | (68, 0, 349) |
| 30 | 523, 755 | (68, 0, 363) |
| 31 | 557, 625 | (68, 0, 363) |
| 32 | 453, 771 | (70, 0, 496) |
| 33 | 477, 651 | (70, 0, 496) |
| 34 | 515, 567 | (123, 0, 589) |
| 35 | 545, 735 | (123, 0, 589) |

A R=1/2 convolutional code with the highest performance is searched by verifying the performance of the respective R=1/2 convolutional codes in Table 2. In addition, the performance of each of the R=1/2 convolutional codes is compared with the performance of the optimal R=1/2 convolutional code used by the IS-95 system.

<Case 1> generator polynomial→$(435, 657)_8$, NO=1, $c_{12}=33$

<Case 2> generator polynomial→$(561, 753)_8$, NO=2, $c_{12}=33$, an optimal R=1/2 convolutional code used for the IS-95 standard <Case 3> generator polynomial→$(557, 751)_8$, NO=7, $c_{12}=40$ <Case 4> generator polynomial→$(453, 755)_8$, NO=9, $c_{12}=40$ <Case 5> generator polynomial→$(471, 673)_8$, NO=11, $c_{12}=50$ <Case 6> generator polynomial→$(531, 657)_8$, NO=17, $c_{12}=52$ <Case 7> generator polynomial→$(561, 755)_8$, NO=22, $c_{12}=57$ <Case 8> generator polynomial→$(465, 771)_8$, NO=24, $c_{12}=58$ A performance comparison among the respective cases is shown in FIG. 12. FIG. 12 illustrates a performance comparison among R=1/2 component codes for the R=1/6 convolutional code. It is noted that the R=1/2 component codes for the R=1/6 convolutional code are similar in performance to the optimal R=1/2 convolutional code.

Table 3 illustrates transfer functions for the R=1/6 convolutional codes.

TABLE 3

| No | 1/6 Generator Polynomial (Octal Number) | 1/6 BER coeff. $c_{37}, c_{38}, c_{39}$ | 1/2 BER coeff. $c_{12}$ (1,2;3,4;5,6) | 1/4 BER coeff. $c_{24}$ (1234;1256;3456) |
|---|---|---|---|---|
| 1 | 457 755 551 637 523 727 | (1,4,9) | (40,52,68) | (8,2,5) |
| 2 | 557 751 455 763 625 727 | (1,4,9) | (40,52,68) | (8,2,5) |
| 3 | 457 755 551 637 625 727 | (1,4,9) | (40,52,68) | (8,6,5) |
| 4 | 557 751 455 763 523 727 | (1,4,9) | (40,52,68) | (8,6,5) |
| 5 | 457 755 455 763 625 727 | (1,4,9) | (40,52,68) | (14,6,5) |
| 6 | 557 751 551 637 523 727 | (1,4,9) | (40,52,68) | (14,6,5) |
| 7 | 515 677 453 755 551 717 | (1,6,9) | (38,40,50) | (4,2,1) |
| 8 | 545 773 557 651 455 747 | (1,6,9) | (38,40,50) | (4,2,1) |
| 9 | 515 677 557 651 551 717 | (1,6,12) | (38,40,50) | (4,2,1) |
| 10 | 545 773 453 755 455 747 | (1,6,12) | (38,40,50) | (4,2,1) |
| 11 | 515 677 557 651 455 747 | (1,6,12) | (38,40,50) | (4,8,1) |
| 12 | 545 773 453 755 551 717 | (1,6,12) | (38,40,50) | (4,8,1) |
| 13 | 457 755 465 753 551 637 | (1,6,12) | (40,52,52) | (6,8,5) |
| 14 | 457 755 531 657 551 637 | (1,6,12) | (40,52,52) | (6,8,5) |
| 15 | 557 751 455 763 465 753 | (1,6,12) | (40,52,52) | (8,6,5) |
| 16 | 557 751 455 763 531 657 | (1,6,12) | (40,52,52) | (8,6,5) |
| 17 | 557 751 465 753 551 637 | (1,6,12) | (40,52,52) | (6,14,5) |
| 18 | 557 751 531 657 551 637 | (1,6,12) | (40,52,52) | (6,14,5) |
| 19 | 457 755 455 763 465 753 | (1,6,12) | (40,52,52) | (14,6,5) |
| 20 | 457 755 455 763 531 657 | (1,6,12) | (40,52,52) | (14,6,5) |
| 21 | 557 751 455 763 515 567 | (1,6,9) | (40,52,123) | (8,6,1) |
| 22 | 457 755 551 637 545 735 | (1,6,9) | (40,52,123) | (8,6,1) |
| 23 | 457 755 551 637 515 567 | (1,6,9) | (40,52,123) | (8,8,1) |
| 24 | 557 751 455 763 545 735 | (1,6,9) | (40,52,123) | (8,8,1) |
| 25 | 557 751 551 637 515 567 | (1,6,9) | (40,52,123) | (14,6,1) |
| 26 | 457 755 455 763 545 735 | (1,6,9) | (40,52,123) | (14,6,1) |
| 27 | 515 677 551 717 531 657 | (1,8,6) | (38,50,52) | (2,6,4) |
| 28 | 545 773 455 747 465 753 | (1,8,6) | (38,50,52) | (2,6,4) |
| 29 | 515 677 455 747 531 657 | (1,8,6) | (38,50,52) | (8,6,4) |
| 30 | 545 773 551 717 465 753 | (1,8,6) | (38,50,52) | (8,6,4) |
| 31 | 453 755 557 751 455 747 | (1,10,15) | (40,40,50) | (4,1,6) |

TABLE 3-continued

| No | 1/6 Generator Polynomial (Octal Number) | 1/6 BER coeff. $c_{37}, c_{38}, c_{39}$ | 1/2 BER coeff. $c_{12}$ (1,2;3,4;5,6) | 1/4 BER coeff. $c_{24}$ (1234;1256;3456) |
|---|---|---|---|---|
| 32 | 457 755 557 651 551 717 | (1,10,15) | (40,40,50) | (4,6,1) |
| 33 | 453 755 557 751 551 717 | (1,10,15) | (40,40,50) | (4,1,12) |
| 34 | 457 755 557 651 455 747 | (1,10,15) | (40,40,50) | (4,11,1) |
| 35 | 453 755 457 755 551 717 | (1,10,15) | (40,40,50) | (14,1,6) |
| 36 | 557 651 557 751 455 747 | (1,10,15) | (40,40,50) | (14,1,6) |
| 37 | 457 755 551 637 557 625 | (1,10,9) | (40,52,68) | (8,2,11) |
| 38 | 557 751 455 763 523 755 | (1,10,9) | (40,52,68) | (2,2,11) |
| 39 | 457 755 455 763 523 727 | (1,10,9) | (40,52,68) | (14,2,5) |
| 40 | 457 755 455 763 557 625 | (1,10,9) | (40,52,68) | (14,2,5) |
| 41 | 557 751 551 637 523 755 | (1,10,9) | (40,52,68) | (14,2,5) |
| 42 | 557 751 551 637 625 727 | (1,10,9) | (40,52,68) | (14,2,5) |
| 43 | 457 755 551 637 523 755 | (1,10,9) | (40,52,68) | (8,14,5) |
| 44 | 557 751 455 763 557 625 | (1,10,9) | (40,52,68) | (8,14,5) |
| 45 | 545 773 455 763 515 567 | (1,10,6) | (38,52,123) | (8,6,1) |
| 46 | 545 773 551 637 515 567 | (1,10,6) | (38,52,123) | (8,6,1) |
| 47 | 515 677 455 763 545 735 | (1,10,6) | (38,52,123) | (8,6,1) |
| 48 | 515 677 551 637 545 735 | (1,10,6) | (38,52,123) | (8,6,1) |
| 49 | 515 677 551 637 515 567 | (1,10,6) | (38,52,123) | (8,18,1) |
| 50 | 545 773 455 763 545 735 | (1,10,6) | (38,52,123) | (8,18,1) |
| 51 | 545 773 557 651 551 717 | (1,12,9) | (38,40,50) | (4,8,1) |
| 52 | 515 677 453 755 455 747 | (1,12,9) | (38,40,50) | (4,8,1) |
| 53 | 457 755 455 763 515 567 | (1,12,9) | (40,52,123) | (14,8,1) |
| 54 | 557 751 551 637 545 735 | (1,12,9) | (40,52,123) | (14,8,1) |
| 55 | 515 677 455 763 515 567 | (1,16,6) | (38,52,123) | (8,18,1) |
| 56 | 545 773 551 637 545 735 | (1,16,6) | (38,52,123) | (8,18,1) |
| 57 | 453 755 457 755 455 747 | (1,20,15) | (40,40,50) | (14,1,2) |
| 58 | 557 651 557 751 551 717 | (1,20,15) | (40,40,50) | (14,1,2) |

The worst performance of the R=1/2 component codes using 5 R=1/6 convolutional codes are as follows, with reference to Table 3.

<Case 1> the worst performance of a R=1/6 convolutional code (NO=1) having generator polynomials of $(457, 755, 551, 637, 523, 727)_8 \rightarrow (523, 727)_8$, $c_{12}=68$ <Case 2> the worst performance of a R=1/6 convolutional code (NO=7) having generator polynomials of $(515, 677, 453, 755, 551, 717)_8 \rightarrow (515, 677)_8$, $c_{12}=38$ <Case 3> the worst performance of a R=1/6 convolutional code (NO=8) having generator polynomials of $(545, 773, 557, 651, 455, 747)_8 \rightarrow (545, 773)_8$, $c_{12}=38$ <Case 4> the worst performance of a R=1/6 convolutional code (NO=11) having generator polynomials of $(551, 677, 557, 651, 455, 747)_8 \rightarrow (551, 677)_8$, $c_{12}=38$ <Case 5> the worst performance of a R=1/6 convolutional code (NO=29) having generator polynomials of $(515, 677, 455, 747, 531, 657)_8 \rightarrow (515, 677)_8$, $c_{12}=38$ The worst performances for the R=1/4 component codes are as follows using the R=1/6 convolutional codes whose performances are verified for the R=1/2 component codes.

<Case 1> the worst performance of a R=1/6 convolutional code (NO=1) having generator polynomials of $(457, 755, 551, 637, 523, 727)_8 \rightarrow (551, 637, 523, 727)_8$, $c_{24}=5$ <Case 2> the worst performance of a R=1/6 convolutional code (NO=7) having generator polynomials of $(515, 677, 453, 755, 551, 717)_8 \rightarrow (515, 677, 551, 717)_8$, $C_{24}=2$ <Case 3> the worst performance of a R=1/6 convolutional code (NO=8) having generator polynomials of $(545, 773, 557, 651, 455, 747)_8 \rightarrow (545, 773, 455, 747)_8$, $c_{24}=2$ <Case 4> the worst performance of a R=1/6 convolutional code (NO=11) having generator polynomials of $(551, 677, 557, 651, 455, 747)_8 \rightarrow (551, 677, 557, 651)_8$, $c_{24}=4$ <Case 5> the worst performance of a R=1/6 convolutional code (NO=29) having generator polynomials of $(515, 677, 455, 747, 531, 657)_8 \rightarrow (515, 677, 531, 657)_8$, $c_{24}=6$ FIG. 13 illustrates a comparison among the worst performances of R=1/2 component codes using R=1/6 convolutional code with the highest performance.

The following are two R=1/6 convolutional codes with good decoding performance which were selected among the R=1/6 convolutional codes whose performances were verified for various cases in the above examples.

1) $(515, 677, 453, 755, 551, 717)_8$: $c_{38}=6$ (NO=7)

2) $(545, 773, 557, 651, 455, 747)_8$: $c_{38}=6$ (NO=8)

Further, to search for a symbol deleting pattern used for the three-carrier system, various symbol deleting matrixes are considered for the situation where one carrier is damaged, i.e., where the R=1/6 convolutional codes change to R=1/4 convolutional codes. The reason for searching for the symbol deleting matrix pattern is the same as described for the R=1/3 convolutional codes. The following matrixes can be used as a symbol deleting matrix pattern for a method of distributing symbols for R=1/6 convolutional codes.

$$D_1 = \begin{bmatrix} 0 & 1 & 1 \\ 0 & 1 & 1 \\ 1 & 0 & 1 \\ 1 & 0 & 1 \\ 1 & 1 & 0 \\ 1 & 1 & 0 \end{bmatrix} \quad D_2 = \begin{bmatrix} 1 & 1 & 0 \\ 1 & 1 & 0 \\ 1 & 0 & 1 \\ 1 & 0 & 1 \\ 0 & 1 & 1 \\ 0 & 1 & 1 \end{bmatrix}$$

$$D_3 = \begin{bmatrix} 0 & 1 & 1 \\ 1 & 0 & 1 \\ 1 & 1 & 0 \\ 0 & 1 & 1 \\ 1 & 0 & 1 \\ 1 & 1 & 0 \end{bmatrix} \quad D_4 = \begin{bmatrix} 1 & 1 & 0 \\ 1 & 0 & 1 \\ 0 & 1 & 1 \\ 1 & 1 & 0 \\ 1 & 0 & 1 \\ 0 & 1 & 1 \end{bmatrix}$$

$$D_5 = \begin{bmatrix} 0 & 1 & 1 & 1 & 0 & 1 \\ 1 & 0 & 1 & 1 & 1 & 0 \\ 0 & 1 & 0 & 1 & 1 & 1 \\ 1 & 0 & 1 & 0 & 1 & 1 \\ 1 & 1 & 0 & 1 & 0 & 1 \\ 1 & 1 & 1 & 0 & 1 & 0 \end{bmatrix} \quad D_6 = \begin{bmatrix} 1 & 1 & 1 & 0 & 1 & 0 \\ 1 & 1 & 0 & 1 & 0 & 1 \\ 1 & 0 & 1 & 0 & 1 & 1 \\ 0 & 1 & 0 & 1 & 1 & 1 \\ 1 & 0 & 1 & 1 & 1 & 0 \\ 0 & 1 & 1 & 1 & 0 & 1 \end{bmatrix}$$

$$D_7 = \begin{bmatrix} 0 & 1 & 1 \\ 1 & 0 & 1 \\ 1 & 1 & 0 \\ 1 & 1 & 0 \\ 1 & 0 & 1 \\ 0 & 1 & 1 \end{bmatrix} \quad D_8 = \begin{bmatrix} 1 & 1 & 0 \\ 1 & 0 & 1 \\ 0 & 1 & 1 \\ 0 & 1 & 1 \\ 1 & 0 & 1 \\ 1 & 1 & 0 \end{bmatrix}$$

$$D_9 = \begin{bmatrix} 0 & 1 & 1 & 1 & 1 & 0 \\ 1 & 0 & 1 & 1 & 0 & 1 \\ 1 & 1 & 0 & 0 & 1 & 1 \\ 0 & 1 & 1 & 1 & 1 & 0 \\ 1 & 0 & 1 & 1 & 0 & 1 \\ 1 & 1 & 0 & 0 & 1 & 1 \end{bmatrix} \quad D_{10} = \begin{bmatrix} 1 & 1 & 0 & 0 & 1 & 1 \\ 1 & 0 & 1 & 1 & 0 & 1 \\ 0 & 1 & 1 & 1 & 1 & 0 \\ 1 & 1 & 0 & 0 & 1 & 1 \\ 1 & 0 & 1 & 1 & 0 & 1 \\ 0 & 1 & 1 & 1 & 1 & 0 \end{bmatrix}$$

$$D_{11} = \begin{bmatrix} 0 & 1 & 1 & 1 & 1 & 0 \\ 1 & 0 & 1 & 1 & 0 & 1 \\ 1 & 1 & 0 & 0 & 1 & 1 \\ 1 & 1 & 0 & 0 & 1 & 1 \\ 1 & 0 & 1 & 1 & 0 & 1 \\ 0 & 1 & 1 & 1 & 1 & 0 \end{bmatrix} \quad D_{12} = \begin{bmatrix} 1 & 1 & 0 & 0 & 1 & 1 \\ 1 & 0 & 1 & 1 & 0 & 1 \\ 0 & 1 & 1 & 1 & 1 & 0 \\ 0 & 1 & 1 & 1 & 1 & 0 \\ 1 & 0 & 1 & 1 & 0 & 1 \\ 1 & 1 & 0 & 0 & 1 & 1 \end{bmatrix}$$

Taking into consideration the case where two carriers are damaged in the three-carrier system, the following symbol deleting matrix patterns can be used in a method of distributing symbols for R=1/2 symbol-deleted convolutional codes using generator polynomials for the R=1/6 convolutional codes with good decoding performance.

$$D_{2-1} = \begin{bmatrix} 1 & 0 & 0 \\ 1 & 0 & 0 \\ 0 & 1 & 0 \\ 0 & 1 & 0 \\ 0 & 0 & 1 \\ 0 & 0 & 1 \end{bmatrix} \quad D_{2-2} = \begin{bmatrix} 0 & 0 & 1 \\ 0 & 0 & 1 \\ 0 & 1 & 0 \\ 0 & 1 & 0 \\ 1 & 0 & 0 \\ 1 & 0 & 0 \end{bmatrix}$$

$$D_{2-3} = \begin{bmatrix} 1 & 0 & 0 \\ 0 & 1 & 0 \\ 0 & 0 & 1 \\ 1 & 0 & 0 \\ 0 & 1 & 0 \\ 0 & 0 & 1 \end{bmatrix} \quad D_{2-4} = \begin{bmatrix} 0 & 0 & 1 \\ 0 & 1 & 0 \\ 1 & 0 & 0 \\ 0 & 0 & 1 \\ 0 & 1 & 0 \\ 1 & 0 & 0 \end{bmatrix}$$

$$D_{2-5} = \begin{bmatrix} 1 & 0 & 0 & 0 & 1 & 0 \\ 0 & 1 & 0 & 0 & 0 & 1 \\ 1 & 0 & 1 & 0 & 0 & 0 \\ 0 & 1 & 0 & 1 & 0 & 0 \\ 0 & 0 & 1 & 0 & 1 & 0 \\ 0 & 0 & 0 & 1 & 0 & 1 \end{bmatrix} \quad D_{2-6} = \begin{bmatrix} 0 & 0 & 0 & 1 & 0 & 1 \\ 0 & 0 & 1 & 0 & 1 & 0 \\ 0 & 1 & 0 & 1 & 0 & 0 \\ 1 & 0 & 1 & 0 & 0 & 0 \\ 0 & 1 & 0 & 0 & 0 & 1 \\ 1 & 0 & 0 & 0 & 1 & 0 \end{bmatrix}$$

$$D_{2-7} = \begin{bmatrix} 1 & 0 & 0 \\ 0 & 1 & 0 \\ 0 & 0 & 1 \\ 0 & 0 & 1 \\ 0 & 1 & 0 \\ 1 & 0 & 0 \end{bmatrix} \quad D_{2-8} = \begin{bmatrix} 0 & 0 & 1 \\ 0 & 1 & 0 \\ 1 & 0 & 0 \\ 1 & 0 & 0 \\ 0 & 1 & 0 \\ 0 & 0 & 1 \end{bmatrix}$$

$$D_{2-9} = \begin{bmatrix} 1 & 0 & 0 & 0 & 0 & 1 \\ 0 & 1 & 0 & 0 & 1 & 0 \\ 0 & 0 & 1 & 1 & 0 & 0 \\ 1 & 0 & 0 & 0 & 0 & 1 \\ 0 & 1 & 0 & 0 & 1 & 0 \\ 0 & 0 & 1 & 1 & 0 & 0 \end{bmatrix} \quad D_{2-10} = \begin{bmatrix} 0 & 0 & 1 & 1 & 0 & 0 \\ 0 & 1 & 0 & 0 & 1 & 0 \\ 1 & 0 & 0 & 0 & 0 & 1 \\ 0 & 0 & 1 & 1 & 0 & 0 \\ 0 & 1 & 0 & 0 & 1 & 0 \\ 1 & 0 & 0 & 0 & 0 & 1 \end{bmatrix}$$

$$D_{2-11} = \begin{bmatrix} 1 & 0 & 0 & 0 & 0 & 1 \\ 0 & 1 & 0 & 0 & 1 & 0 \\ 0 & 0 & 1 & 1 & 0 & 0 \\ 0 & 0 & 1 & 1 & 0 & 0 \\ 0 & 1 & 0 & 0 & 1 & 0 \\ 1 & 0 & 0 & 0 & 0 & 1 \end{bmatrix} \quad D_{2-12} = \begin{bmatrix} 0 & 0 & 1 & 1 & 0 & 0 \\ 0 & 1 & 0 & 0 & 1 & 0 \\ 1 & 0 & 0 & 0 & 0 & 1 \\ 1 & 0 & 0 & 0 & 0 & 1 \\ 0 & 1 & 0 & 0 & 1 & 0 \\ 0 & 0 & 1 & 1 & 0 & 0 \end{bmatrix}$$

Turning to FIG. 6, there is shown the convolutional encoder 601 and the symbol distributor 602 according to an embodiment of the present invention. In the exemplary embodiment, the convolutional encoder 601 has a coding rate of R=1/6 and uses generator polynomials of (545, 773, 557, 651, 455, 747). The detailed structure of the R=1/6 convolutional encoder 601 is illustrated in FIG. 7.

Figure 7:
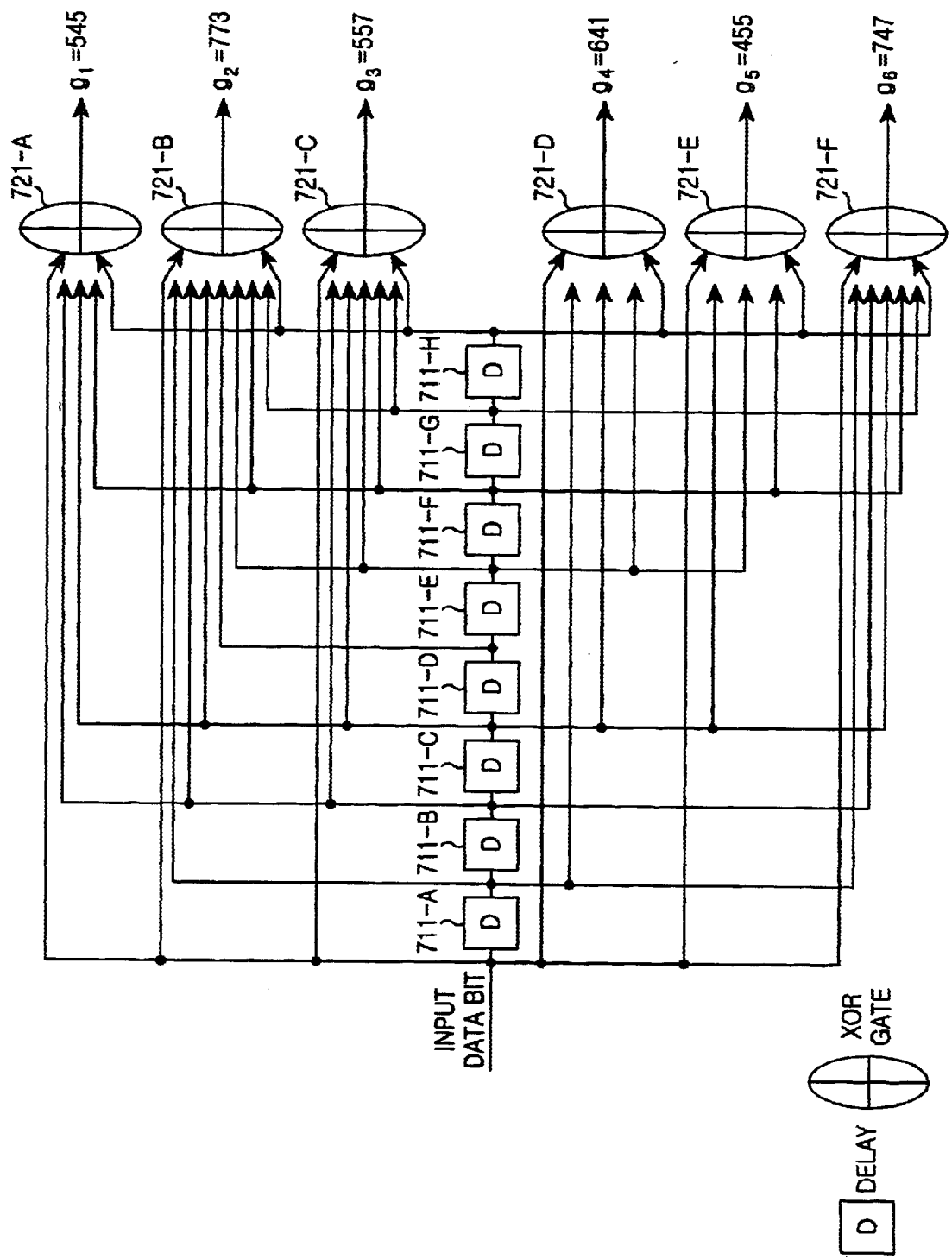
FIG. 7 is a schematic diagram illustrating the R=1/6 convolutional encoder of FIG. 6.

Referring to FIG. 7, upon receipt of input data, delays 711-A to 711-H delay the input data bits sequentially. During the sequential delay of the input data bits, exclusive OR gates 721-A to 721-F output coded symbols. The coded symbols of FIG. 7 are provided to the symbol distributor 602 having the structure as shown by FIG. 8.

Figure 8:
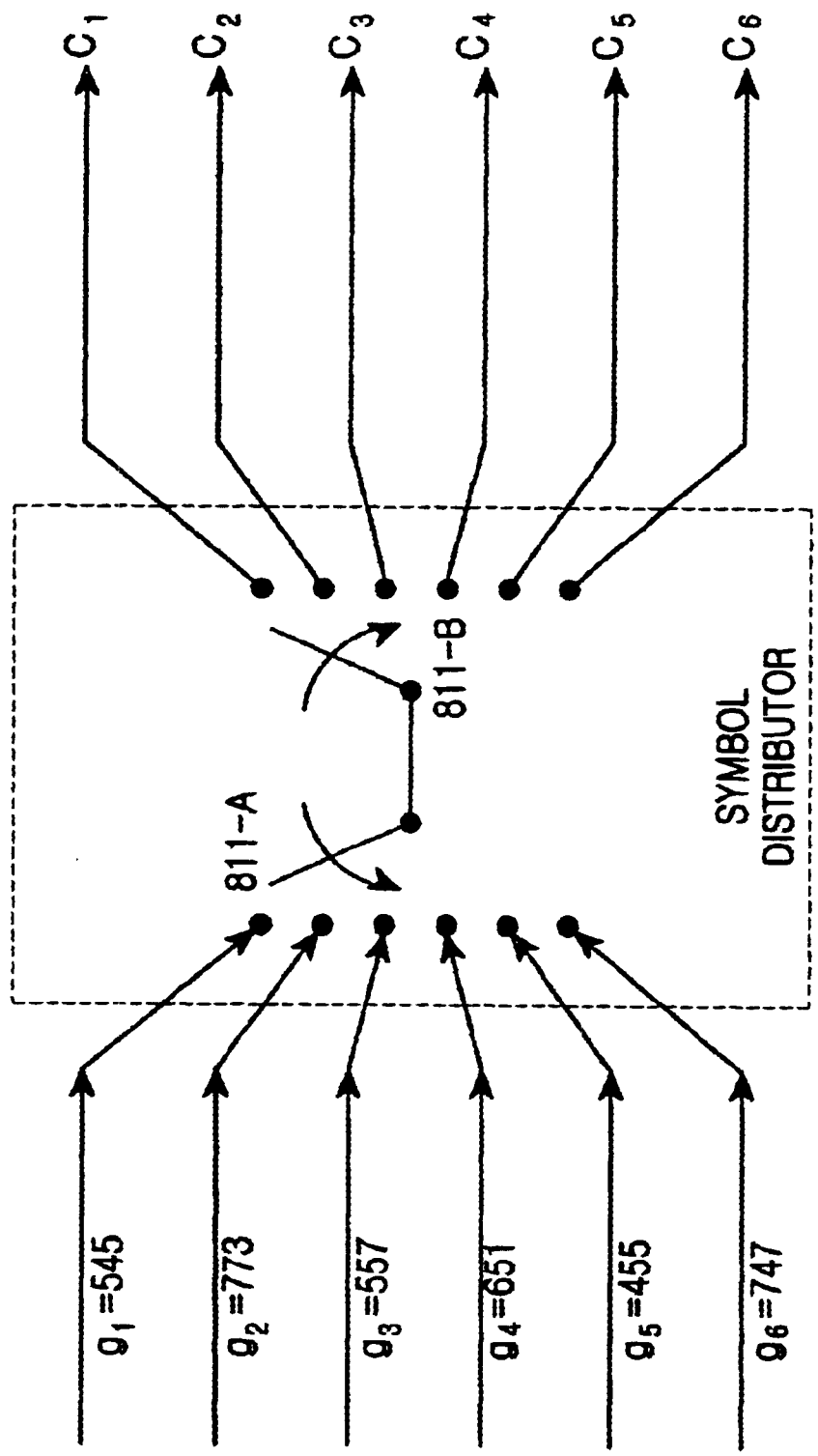
FIG. 8 illustrates the symbol distributor of FIG. 6.

Referring to FIG. 8, the symbol distributor 602 is implemented by switches 811-A and 811-B. In FIG. 8, when a symbol rate of the clock controlling the switches 811-A and 811-B is over six times a symbol rate of the symbol distributor 602, the symbols can be distributed without symbol loss. That is, the switch 811-A sequentially receives input symbols $g_1, g_2, g_3, g_4, g_5, g_6, g_1, g_2, g_3, \ldots$, and the switch 811-B distributes the input symbols to output nodes $c_1, c_2, c_3, c_4, c_5$ and $c_6$.

Figure 9:
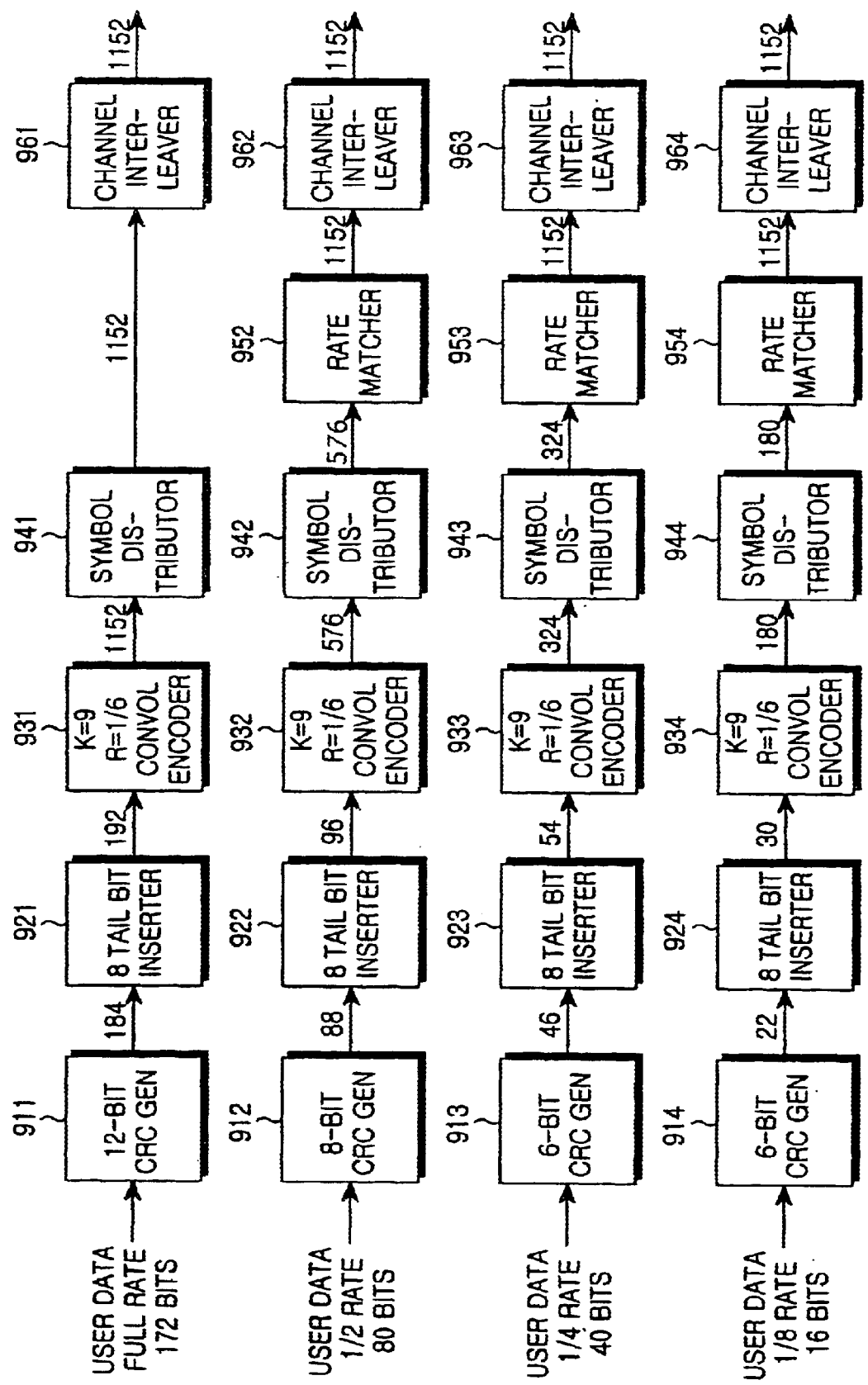
FIG. 9 illustrates block diagrams of a transmission scheme for a forward link using the channel encoder and the symbol distributor according to the present invention.

FIG. 9 illustrates transmission schemes using the channel encoder 601 and the symbol distributor 602 of FIG. 6. First to fourth CRC generators 911–914 add CRC data in a specified number of bits to input data. Specifically, 12-bit CRC is added to the 172-bit data of the first rate; 8-bit CRC is added to the 80-bit data of the second rate, 6-bit CRC is added to the 40-bit data of the third rate; and 6-bit CRC is added to the 16-bit data of the fourth rate. First to fourth tail bit generators 921–924 add 8 tail bits to the CRC-added data. Therefore, the first tail bit generator 921 outputs 192 bits; the second tail bit generator 922 outputs 96 bits; the third tail bit generator 923 outputs 54 bits; and the fourth tail bit generator 924 outputs 30 bits.

First to fourth encoders 931–934 encode data output from the first to fourth tail bit generators 921–924, respectively. Here, a K=9, R=1/6 convolutional encoder can be used for the encoders 931–934. In this case, the first encoder 931 encodes the 192-bit data output from the first tail bit generator 921 into 1152 symbols of full rate; the second encoder 932 encodes the 96-bit data output from the second tail bit generator 922 into 576 symbols of 1/2 rate; the third encoder 933 encodes the 54-bit data output from the third tail bit generator 923 into 324 symbols of about 1/4 rate; and the fourth encoder 934 encodes the 30-bit data output from the fourth tail bit generator 924 into 180 symbols of about 1/8 rate.

First to fourth symbol distributors 941–944 distribute the symbols output from the encoders 931–934, respectively. Here, for symbol distribution, a channel controller (not shown) generates control signals for distributing the channel-coded bits such that performance degradation is minimized during decoding of received damaged bits, when the coded symbols being transmitted are overlaid on the symbols of a different system at the same frequency band. The symbol distributors 941–944 then assign the symbols outputted from the encoders 931–934 to the corresponding carriers according to the control signals.

Rate matchers 951–953 each include a symbol repeater and a symbol deletion device. The rate matchers 951–953 match rates of the symbols outputted from the corresponding symbol distributors 942–944 to a rate of the symbols outputted from the symbol distributor 941. First to fourth channel interleavers 961–964 interleave the symbols outputted from the symbol distributor 941 and the rate matchers 951–953, respectively. The symbol distributors 941–944 can also be connected to the outputs of the channel interleavers 961–964. In this case, the symbol distributors should have different symbol distribution methods modified considering the interleaving pattern into consideration.

The first condition of the R=1/6 convolutional codes in the multicarrier system indicates that the convolutional codes should have as good a decoding performance as the R=1/6 convolutional codes. Therefore, the first to sixth R=1/6 convolutional codes in Table 3 have better weight distribution than the existing R=1/6 convolutional codes (see "Rational Rate Punctured Convolutional Codes for Soft-Decision Viterbi Decoding"-Irina E. Bocharova, D. Kudryashov, IEEE Transaction on Information Theory. July 1997: Volume 43, Number 4).

Table 4 below shows a weight distribution comparison between the existing R=1/6 convolutional codes and the novel R=1/6 convolutional codes.

TABLE 4

Weight Distribution Comparison

| Weight | No 8 | No 1 | No 2 | No 3 | No 4 | No 5 | No 6 | Existing Code |
|---|---|---|---|---|---|---|---|---|
| 0 | 0 | 0 | 0 | 0 | 0 | 0 | 0 | 0 |
| . | . | . | . | . | . | . | . | . |
| . | . | . | . | . | . | . | . | . |
| . | . | . | . | . | . | . | . | . |
| 36 | 0 | 0 | 0 | 0 | 0 | 0 | 0 | 0 |
| 37 | 1 | 1 | 1 | 1 | 1 | 1 | 1 | 1 |
| 38 | 2 | 2 | 2 | 2 | 2 | 2 | 2 | 2 |
| 39 | 3 | 3 | 3 | 3 | 3 | 3 | 3 | 4 |
| 40 | 1 | 2 | 2 | 2 | 2 | 2 | 2 | 1 |
| 41 | 0 | 1 | 1 | 1 | 1 | 1 | 1 | 1 |
| 42 | 0 | 3 | 2 | 5 | 3 | 2 | 5 | 1 |
| 43 | 3 | 2 | 3 | 2 | 2 | 3 | 2 | 2 |
| 44 | 6 | 2 | 1 | 3 | 2 | 1 | 3 | 2 |
| 45 | 8 | 6 | 8 | 8 | 6 | 8 | 8 | 4 |
| 46 | 4 | 5 | 8 | 6 | 5 | 8 | 6 | 3 |
| 47 | 3 | 5 | 4 | 8 | 5 | 4 | 8 | 4 |
| 48 | 9 | 10 | 13 | 13 | 10 | 13 | 13 | 8 |
| 49 | 11 | 12 | 9 | 13 | 12 | 9 | 13 | 14 |
| 50 | 11 | 16 | 13 | 18 | 16 | 13 | 18 | 12 |

A description will now be made of a direct sequence spreading system using the R=1/6 convolutional codes according to an embodiment of the present invention.

Figure 14A:
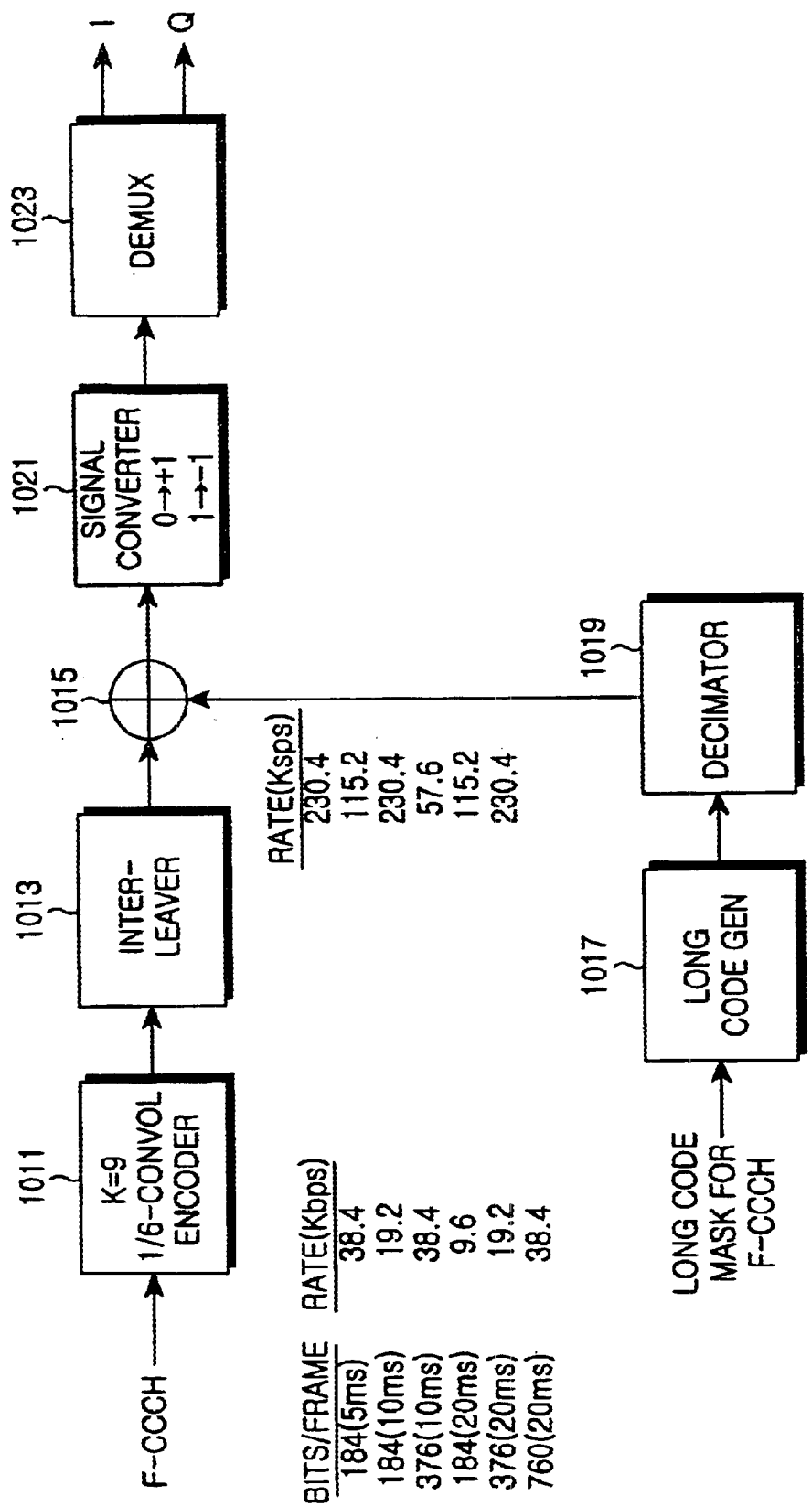
FIGS. 14A to 14C are diagrams illustrating a transmission scheme for a forward common control channel (F-CCCH), a forward dedicated control channel (F-DCCH) and a forward dedicated traffic channel (F-DTCH), respectively, in a DS-CDMA communication system using R=1/6 convolutional codes.
Figure 14B:
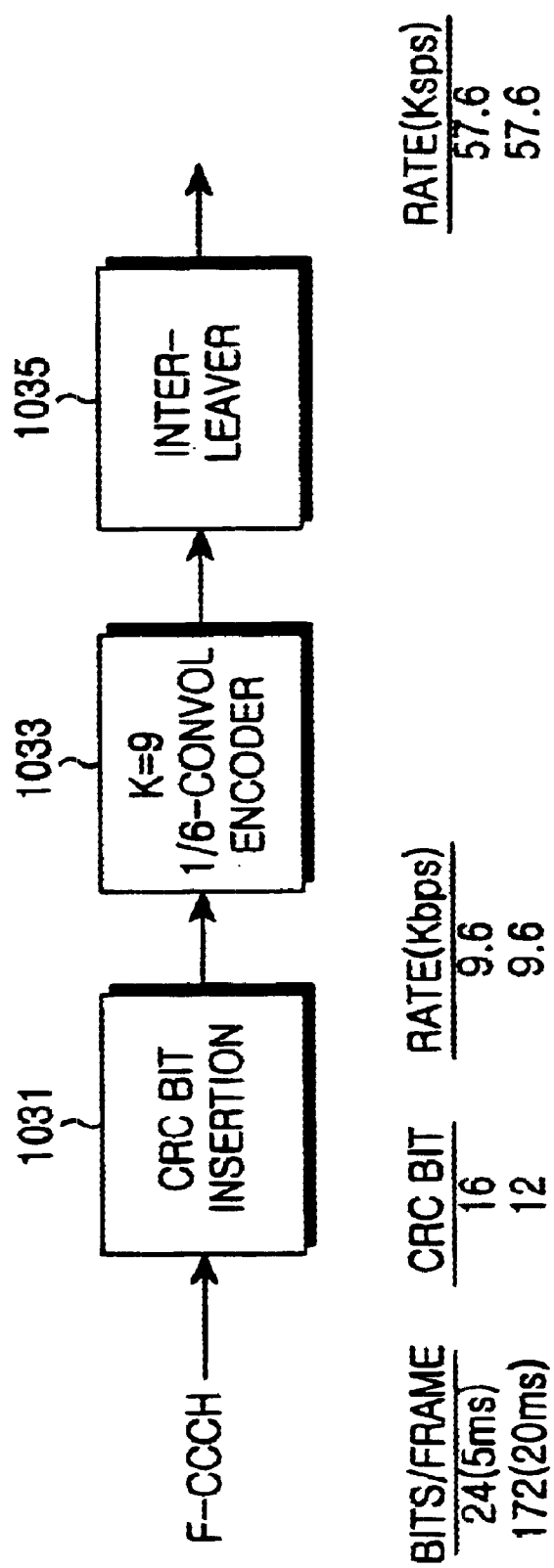
Figure 14C:
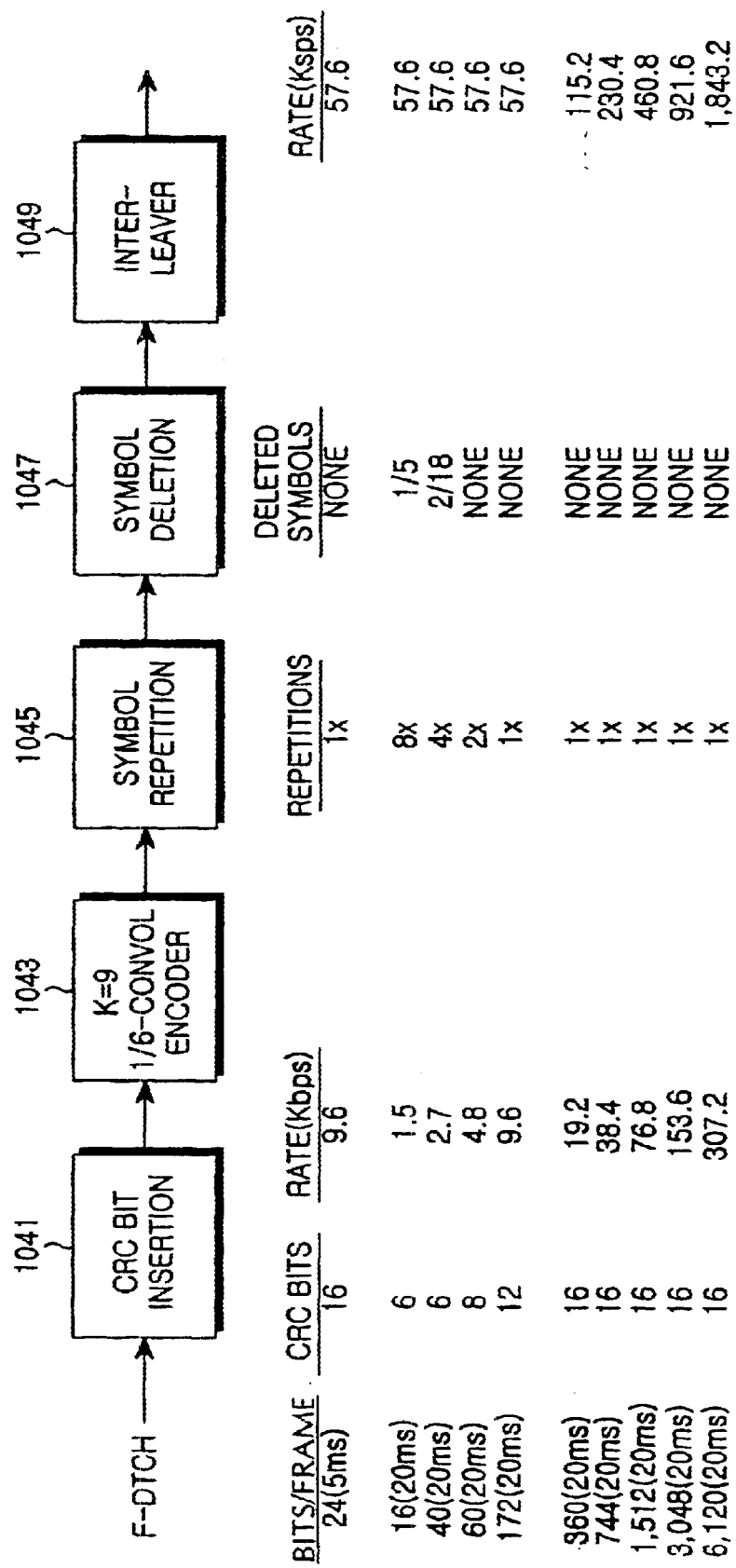

FIGS. 14A to 14C show transmission schemes for a forward common control channel (F-CCCH), a forward dedicated control channel (F-DCCH) and a forward dedicated traffic channel (F-DTCH), respectively, in a DS-CDMA communication system R=1/6 convolutional codes.

Referring to FIG. 14A, channel encoder 1011 and interleaver 1013 of the forward common control channel encodes a forward common control channel message using the K=9, R=1/6 convolutional code and then interleaves the coded symbols. At this point, a long code generator 1017 generates a long code corresponding to an input long code mask for the forward common control channel, and a decimator 1019 extracts every $64^{th}$ bit of the long code outputted from the long code generator 1017. An exclusive OR gate 1015 scrambles the interleaved symbols outputted from the interleaver and the, decimated long code. A signal converter 1021 converts the scrambled signals by converting data of '0' to '+1' and data of '1' to '−1'. The converted signals are divided into I components and Q components by a demultiplexer 1023.

Referring to FIG. 14B, the forward dedicated control channel will be described. Upon receipt of a forward dedicated control channel message, a CRC bit inserter 1031 generates CRC bits according to the forward dedicated control channel message and adds the generated CRC bits in back of the forward dedicated control channel message. A K=9, R=1/6 convolutional encoder 1033 encodes the bits outputted from the CRC bit inserter 1031 and an interleaver 1035 interleaves the coded symbols outputted from the K=9, R=1/6 convolutional encoder 1033.

Referring to FIG. 14C, the forward dedicated traffic channel will be described. Upon receipt of a forward dedicated traffic channel message, a CRC bit inserter 1041 generates CRC bits according to the forward dedicated traffic channel message and adds the generated CRC bits in back of the forward dedicated traffic channel message. A K=9, R=1/6 convolutional encoder 1043 encodes the bits outputted from the CRC bit inserter 1041, and a symbol repeater 1045 repeats the coded symbols according to a data rate of the input frame to match the data rate to a reference rate (e.g., 57.6 Kbps), so as to match the symbol number before the coded symbols are inputted to an interleaver 1049. A symbol deletion device 1047 deletes the symbols according to a rate set, when the number of the repeated symbols exceeds a predetermined value. The interleaver 1049 then interleaves the rate-matched symbols.

In FIGS. 14A to 14C, the convolutional codes of Nos. 1 to 6 or No. 8 in Table 3 can be used for the K=9, R=1/6 convolutional code. FIGS. 15 to 20 show channel encoders for the convolutional codes of Nos. 1 to 6 in Table 3.

Figure 15:
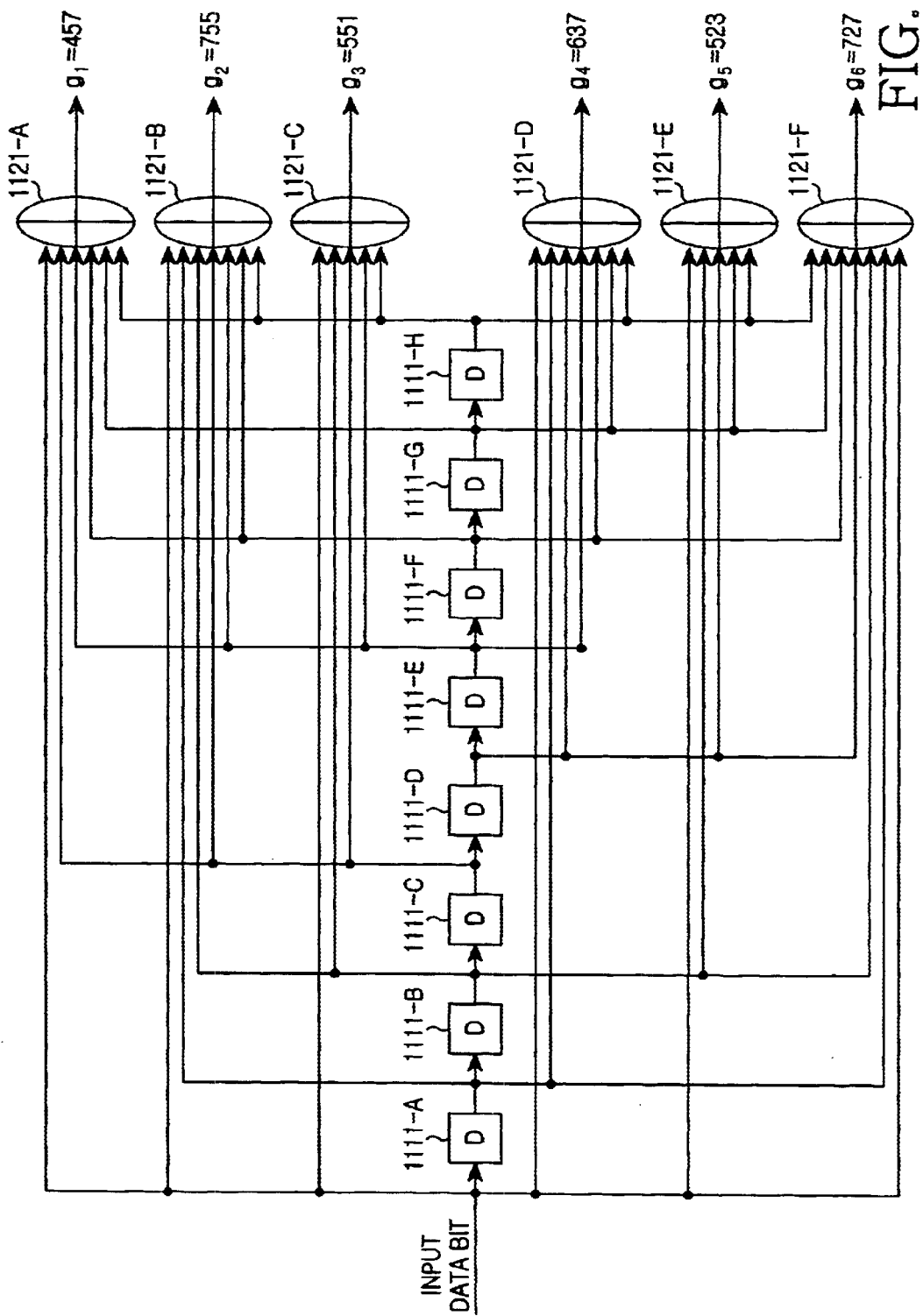
FIGS. 15 to 20 are diagrams illustrating convolutional encoders for the channel transmission scheme of FIGS. 14A to 14C according to an embodiment of the present invention.
Figure 16:
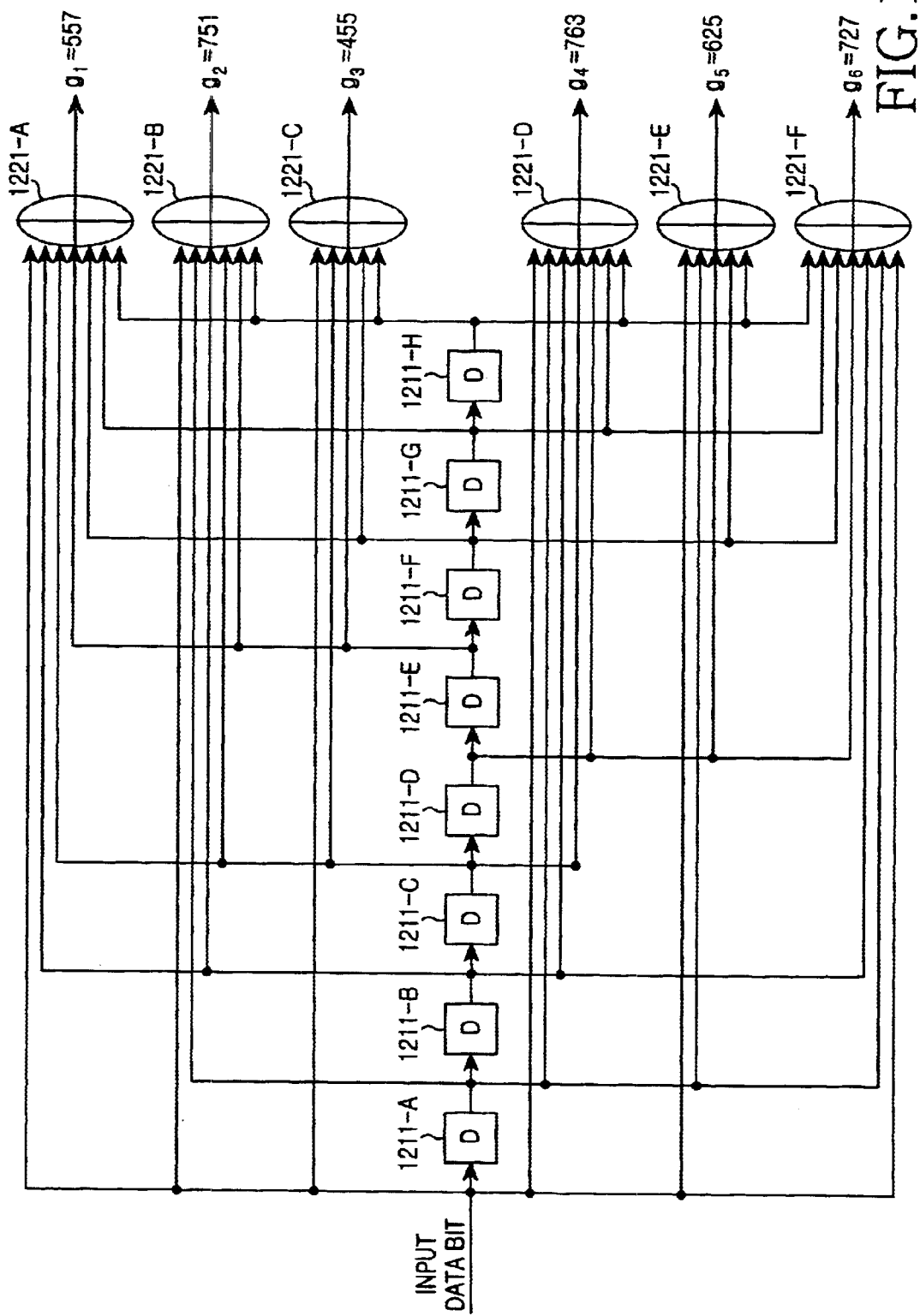
Figure 17:
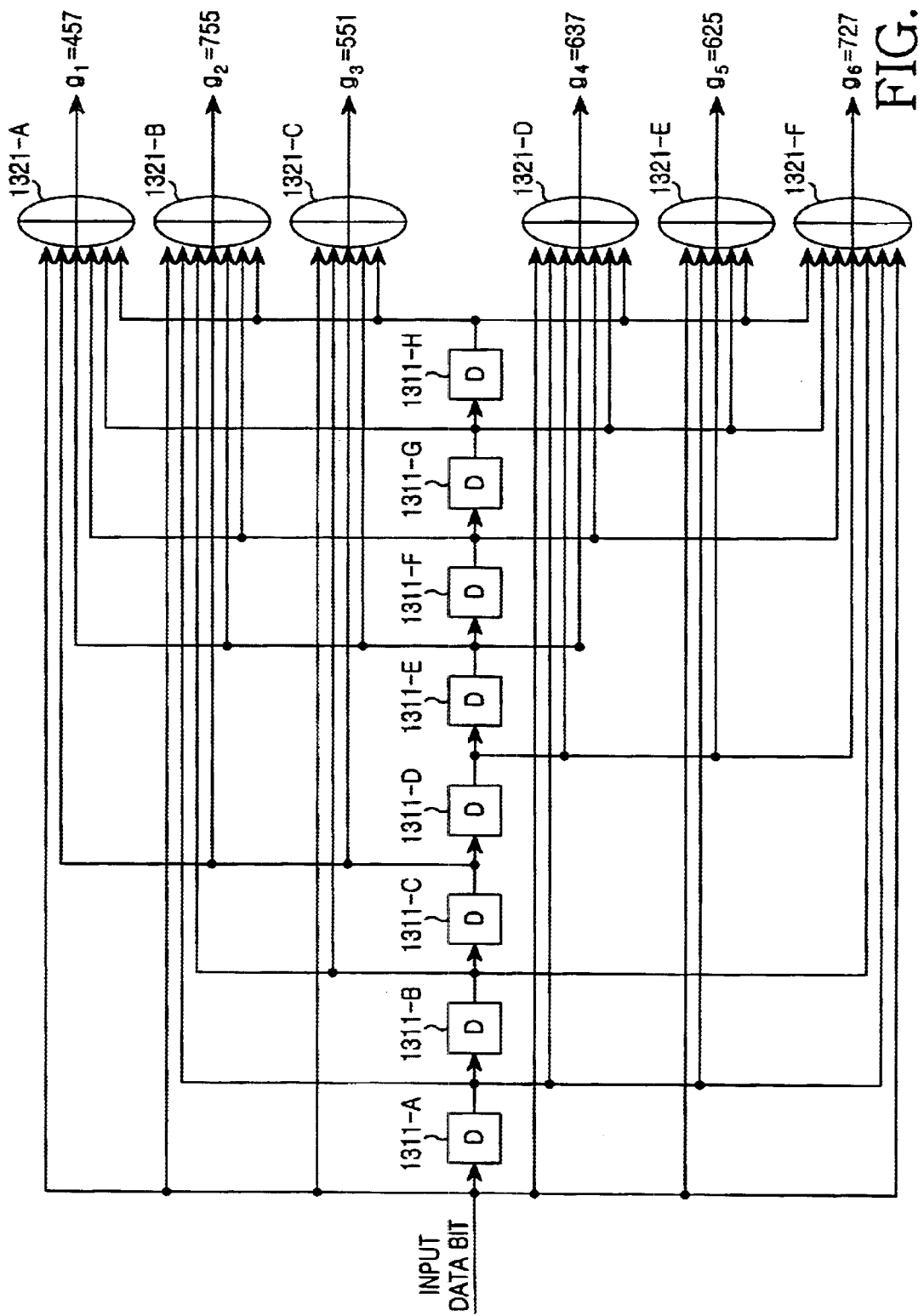
Figure 18:
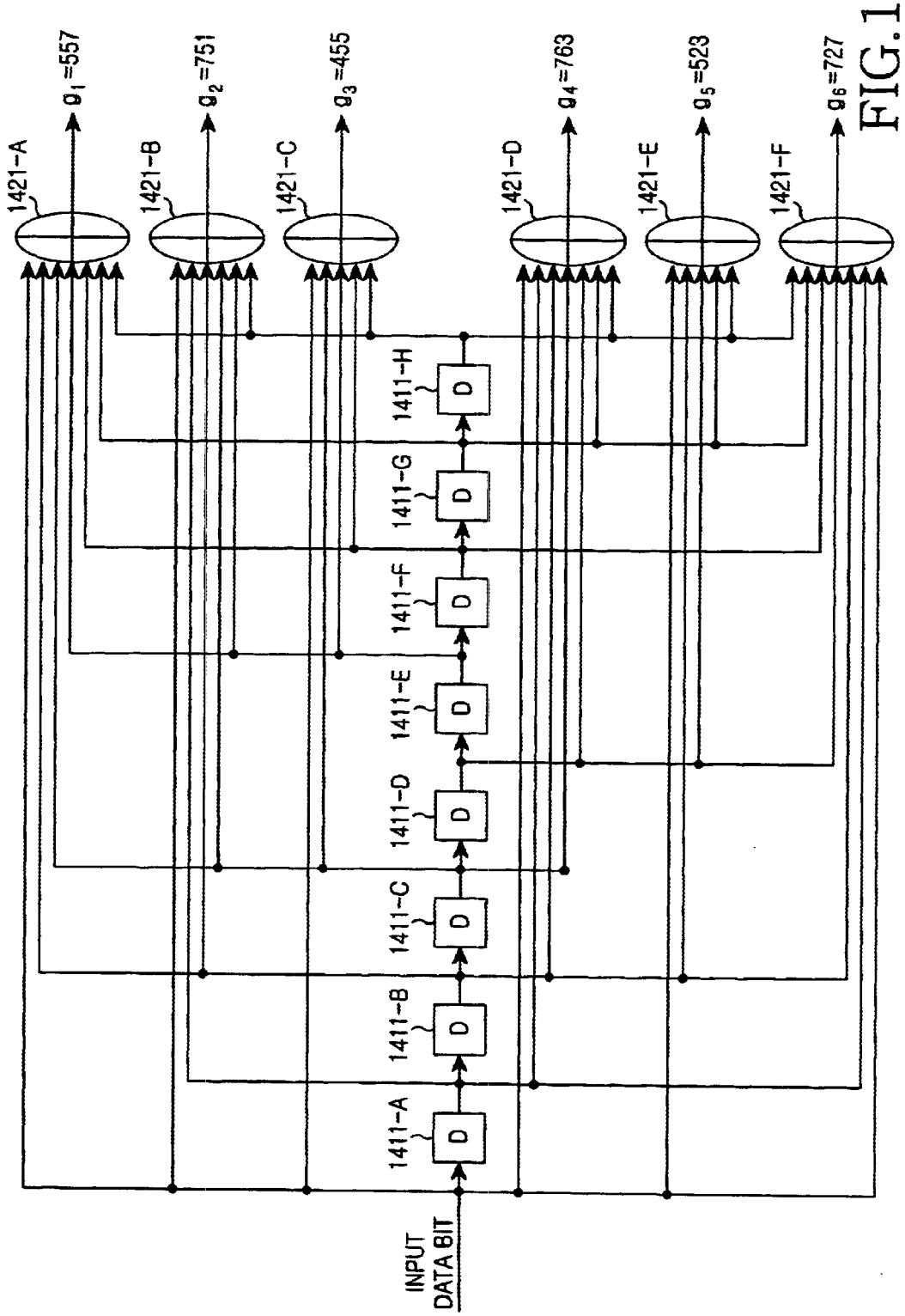
Figure 19:
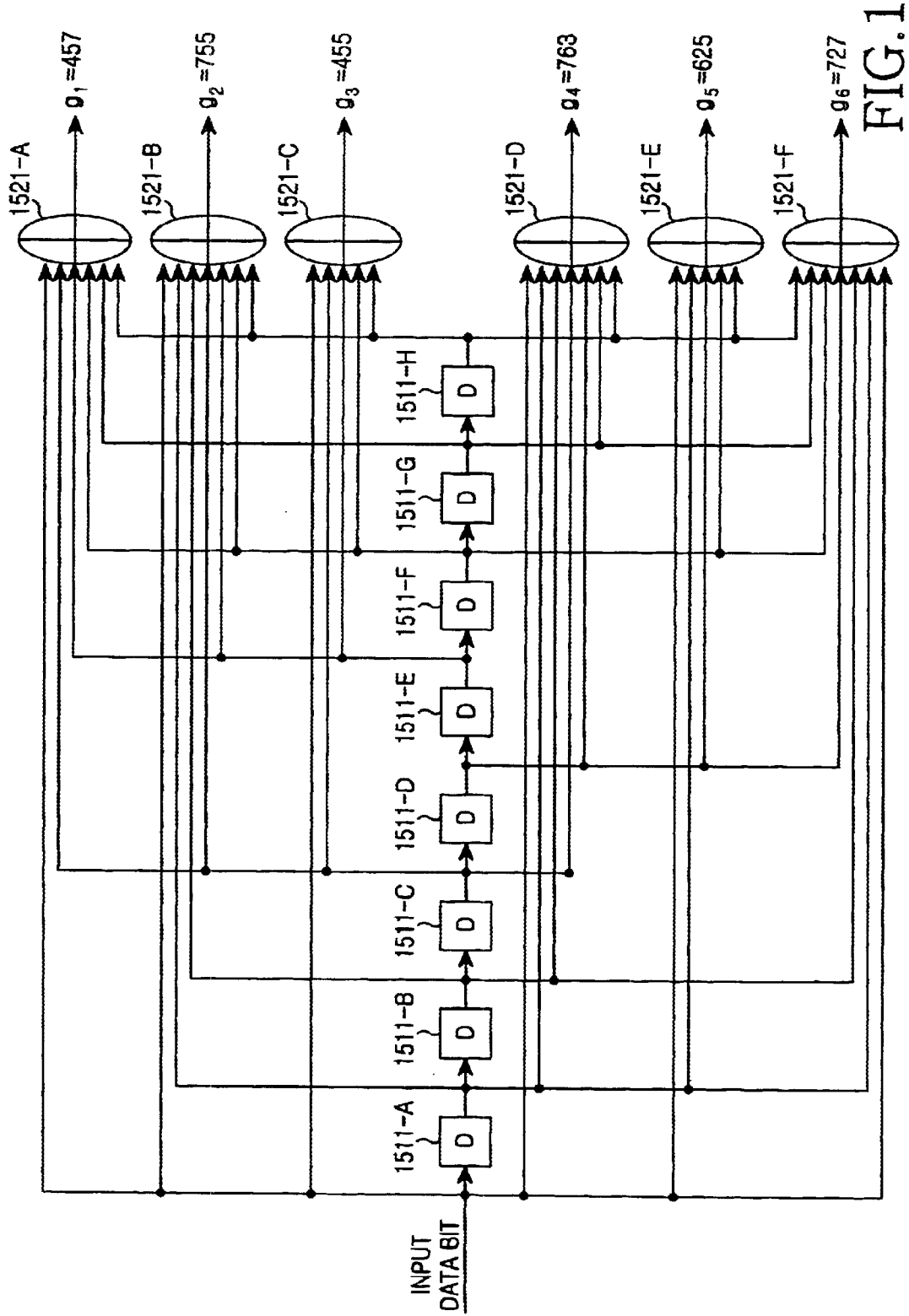
Figure 20:
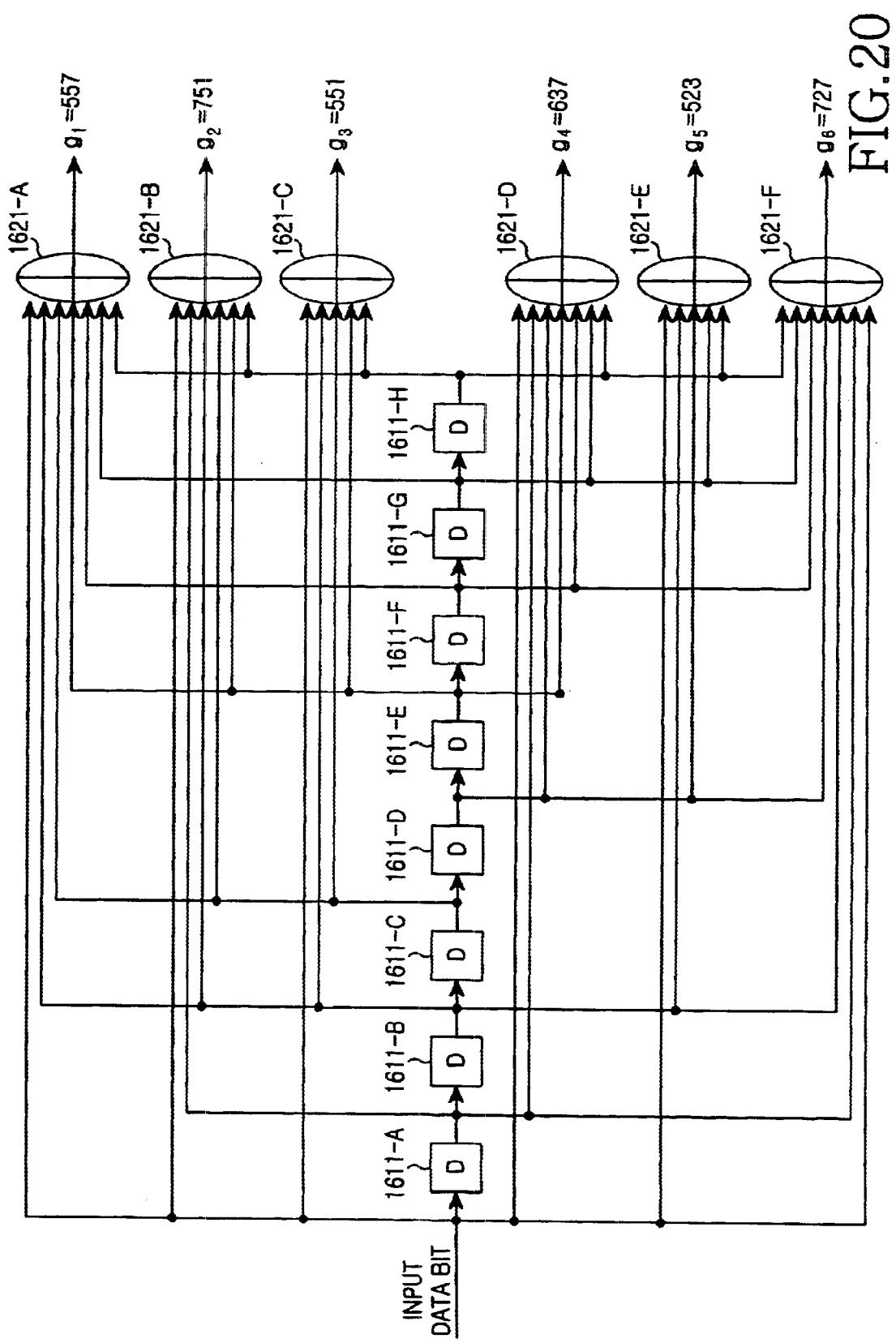

Referring to FIG. 15, delays 1111-A to 1111-H are initially set to '0'. When input data bits are applied to the delay 1111-A, the delay 1111-H provides its output bits to adders (or exclusive OR gates) 1121-A to 1121-F; the delay 1111-G stores its output bits in the delay 1111-H and provides the output bits to the adders 1121-A, 1121-D, 1121-E and 1121-F; the delay 1111-F stores its output bits in the delay 1111-G and provides the output bits to the adders 1121-A, 1121-B, 1121-D and 1121-F; the delay 1111-E stores its output bits in the delay 1111-F and provides the output bits to the adders 1121-A, 1121-B, 1121-C and 1121-D; the delay 1111-D stores its output bits in the delay 1111-E and provides the output bits to the adders 1121-D, 1121-E and 1121-F; the delay 1111-C stores its output bits in the delay 1111-D and provides the output bits to the adders 1121-A, 1121-B and 1121-C; the delay 1111-B stores its output bits in the delay 1111-C and provides the output bits to the adders 1121-B, 1121-C, 1121-E and 1121-F; the delay 1111-A stores its output bits in the delay 1111-B and provides the output bits to the adders 1121-B, 1121-D and 1121-F; and the input data bits are stored in the delay 1111-A and provided to the adders 1121-A to 1121-F. The adders 1121-A to 1121-F exclusively OR their input signals to output 6 XORed values (i.e., coded symbols). In the above process, when one input data bit is received, all the elements operate simultaneously to output the 6 coded symbols. The above procedure is repeated until all the input data bits are received.

The convolutional encoders shown in FIGS. 16 to 20 have similar operation except that the connection of the delays and adders is different according to the generator polynomial of an embodiment of the invention. FIGS. 15 to 20 show the R=1/6 convolutional encoders implemented using the hardware device according to the generator polynomials of an embodiment of the invention. However, it will be understood by those skilled in the art that it is also possible to implement the R=1/6 convolutional encoders according to the generator polynomial using software algorithms.

Figure 21A:
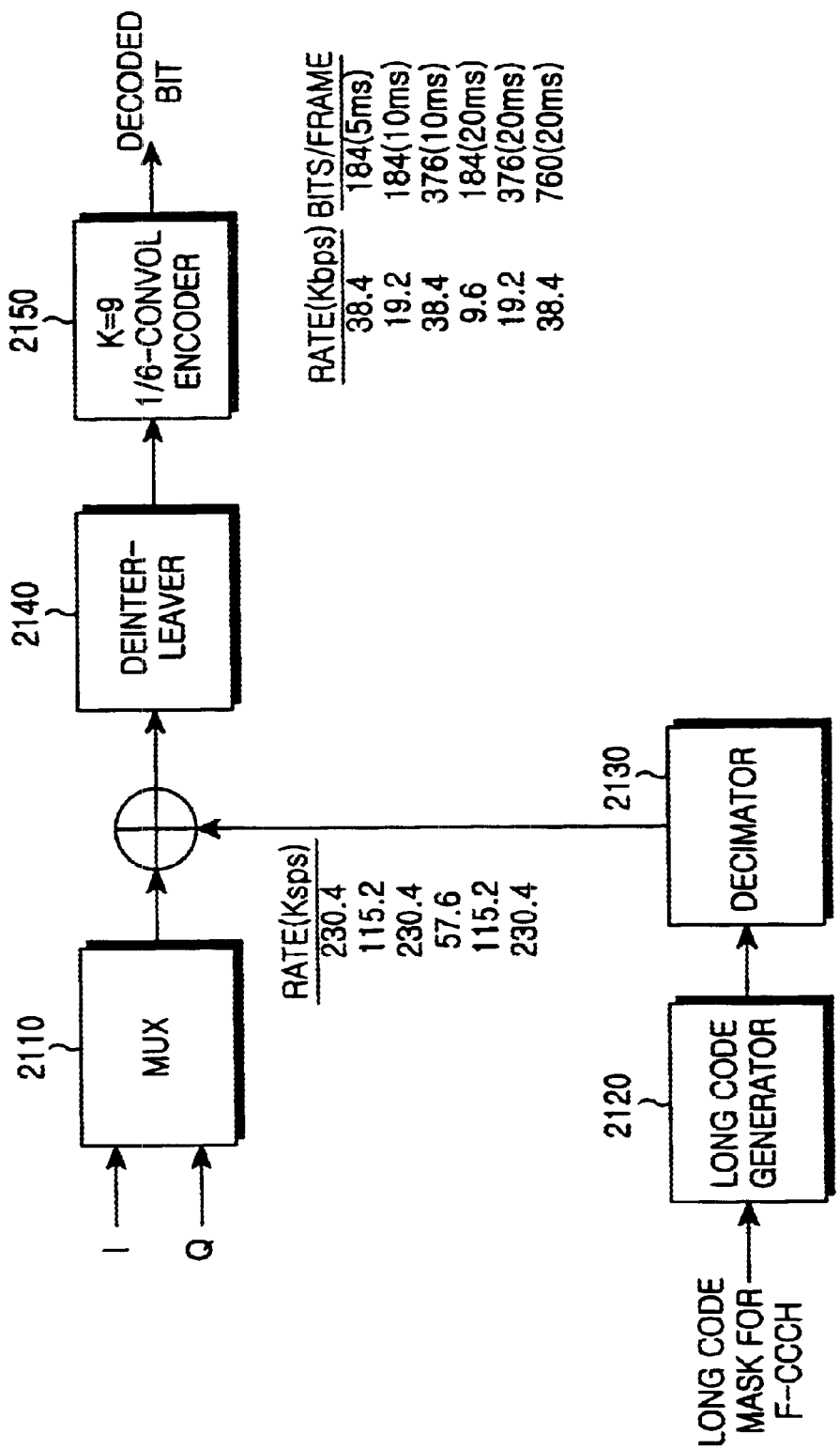
FIGS. 21A to 21C are diagrams illustrating channel receivers corresponding to the channel transmitters of FIGS. 14A to 14C, respectively.
Figure 21B:
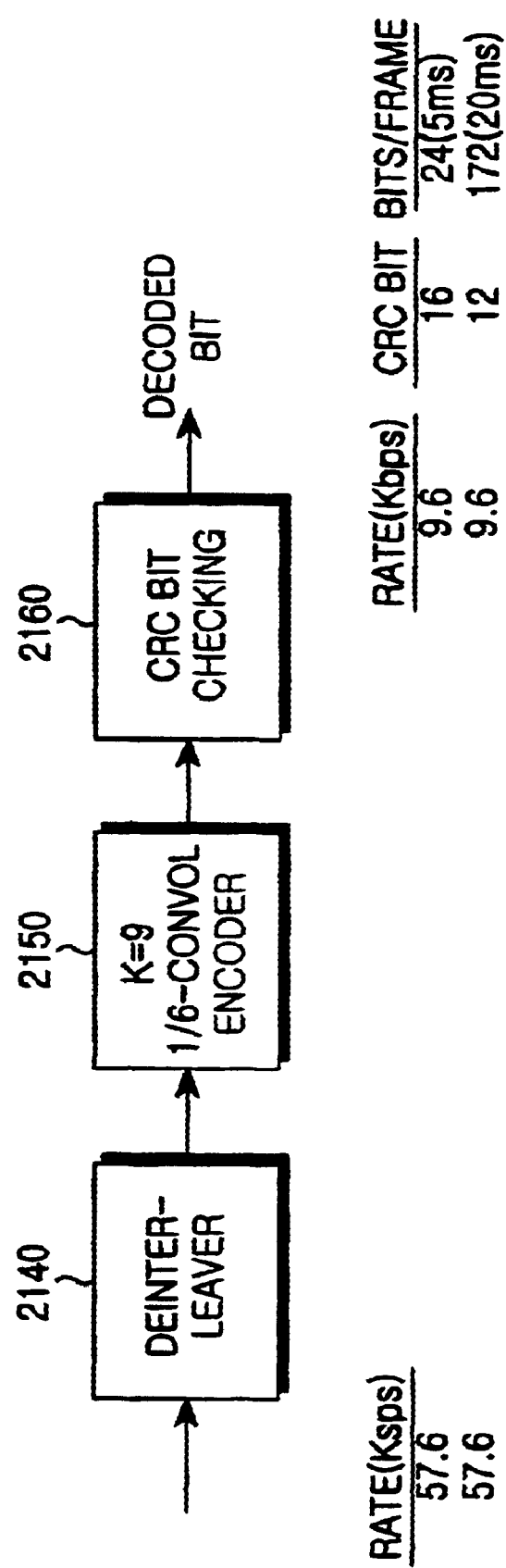
Figure 21C:
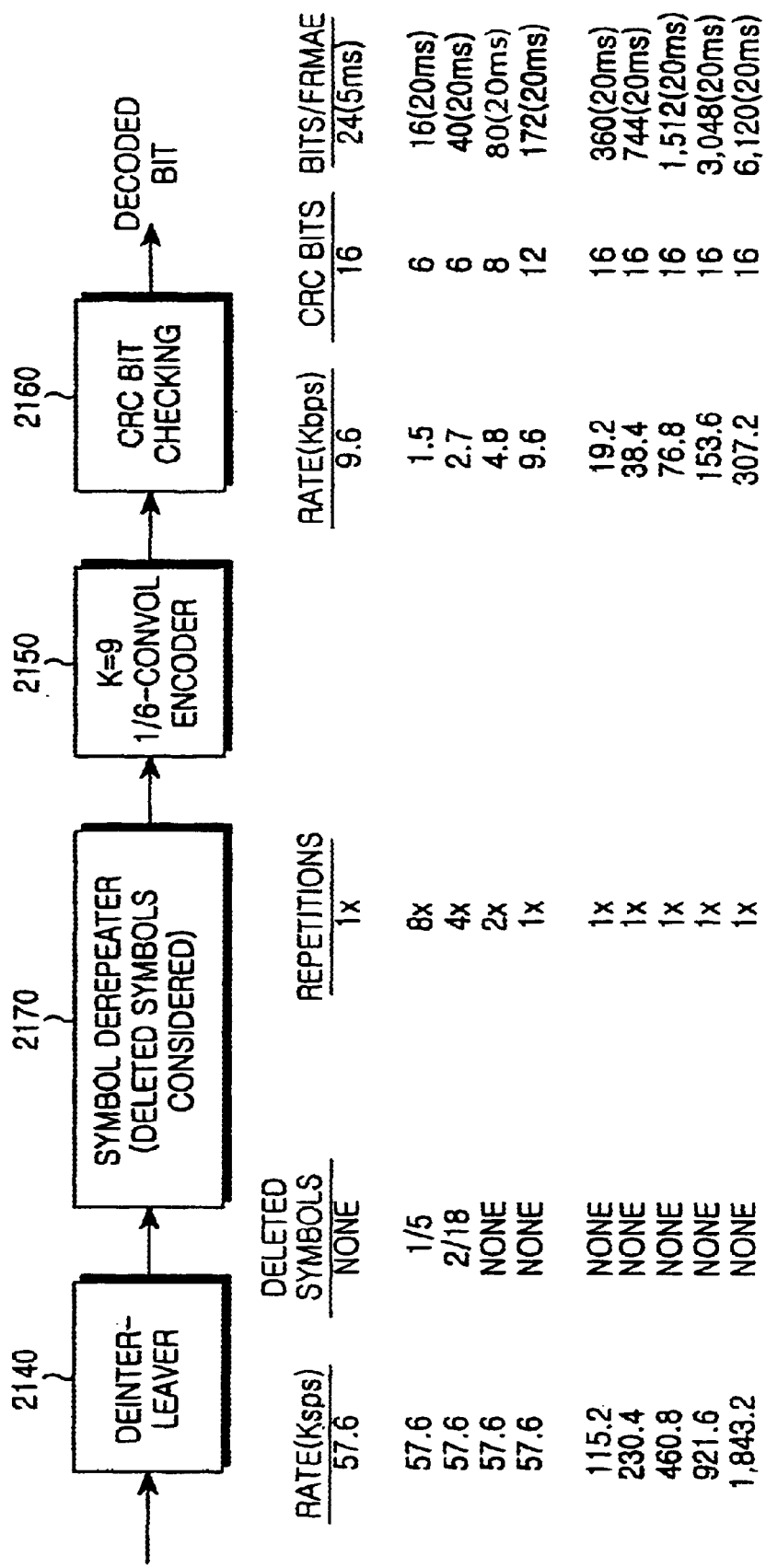

FIGS. 21A to 21C show mobile station receivers for the forward common control channel, the forward dedicated control channel and the forward dedicated traffic channel, respectively, in the DS-CDMA system using the R=1/6 convolutional codes. Such receivers can also receive the signals from a base station having the multicarrier transmitter. However, in FIGS. 21B and 21C, a multiplexing part for multiplexing input multicarrier signals is avoided.

Referring to FIG. 21A, a multiplexer 2110 multiplexes input I- and Q-component signals. At this point, a long code generator 2120 generates a long code corresponding to an input long code mask for the forward common control channel, and a decimator 2130 extracts every 64$^{th}$ bit of the long code outputted from the long code generator. An exclusive OR gate descrambles the multiplexed symbols outputted from the multiplexer and the decimated long code, and a deinterleaver 2140 then deinterleaves the descrambled signals. Thereafter, a Viterbi decoder for a K=9, R=1/6 convolutional encoder 2150 decodes the deinterleaved signals into decoded bits.

Referring to FIG. 21B, a deinterleaver 2140 deinterleaves a received signal, and a Viterbi decoder for a K=9, R=1/6 convolutional encoder 2150 decodes the deinterleaved signals into decoded bits. A CRC bit checking device 2160 generates CRC bits according to the message portion of the decoded bits and compares the generated CRC bits with the decoded CRC bits. If the CRC bits are identical, the message portion of the decoded bits is output as it is, and, if not, a CRC error message is outputted.

Referring to FIG. 21C, a receiver for receiving the forward dedicated traffic channel will be described. A deinterleaver 2140 deinterleaves a received signal, and a symbol derepeater 2170 outputs symbol values considering symbol deletion and symbol repetition. That is, upon receipt of the symbols which were repeated 4 times in the transmitter without symbol deletion, the symbol derepeater 2170 of the receiver adds the 4 repeated symbols. Further, upon receipt of the symbols which were repeated 4 times and one of which was deleted, in the transmitter, the symbol derepeater 2170 of the receiver adds the 3 repeated symbols. A Viterbi decoder for the R=1/6 convolutional encoder 2150 decodes the derepeated symbols outputted from the symbol derepeater into decoded bits. A CRC bit checking device 2160 generates CRC bits according to a message portion of the decoded bits and compares the generated CRC bits with the decoded CRC bits. If the CRC bits are identical, the message portion of the decoded bits is output as it is, and, if not, a CRC error message is outputted.

Figure 22:
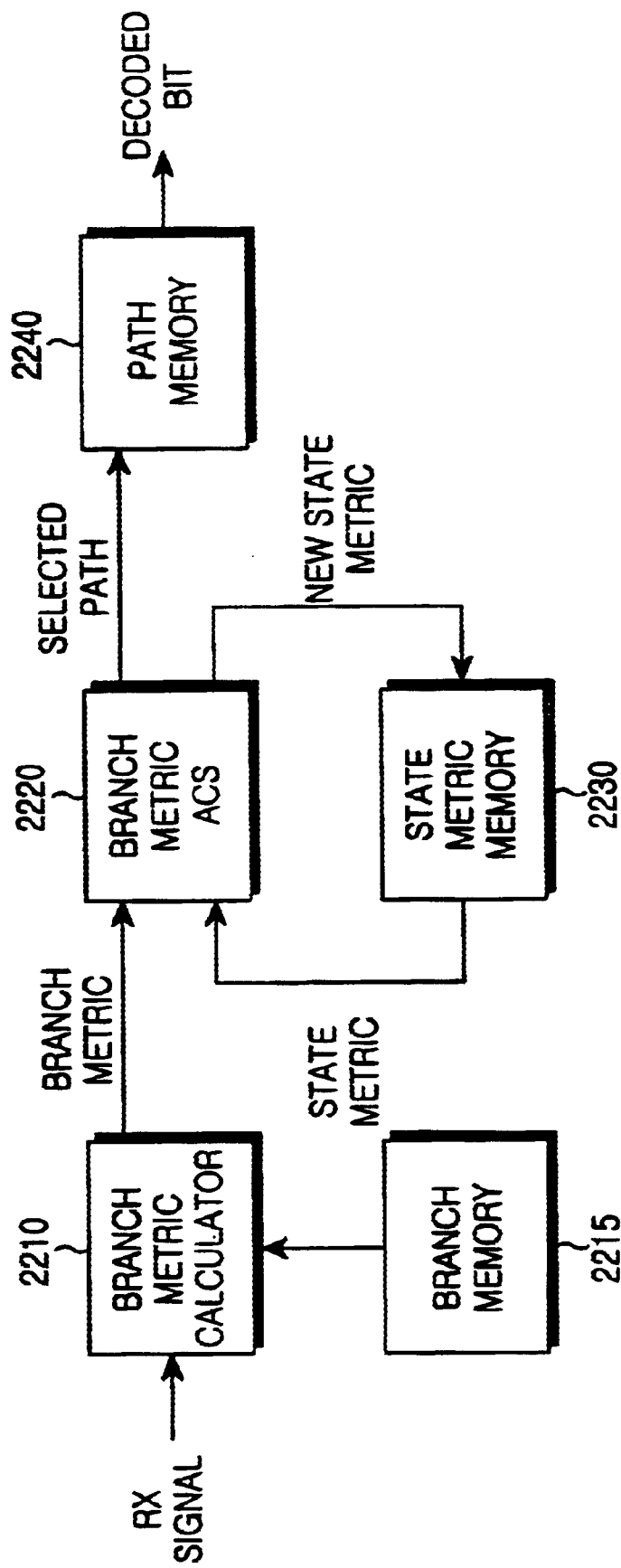
FIG. 22 is a diagram illustrating a convolutional decoder corresponding to the K=9, R=1/6 convolutional encoder of FIG. 15.

FIG. 22 shows a R=1/6 convolutional decoder corresponding to the K=9, R=1/6 convolutional encoder of FIG. 15. The term "state" as used herein refers to the values stored in the 8 delays when one bit is received from the R=1/6 convolutional encoder. If a binary value '00100011' is stored in the 8 delays, the state will be 35 in decimal.

Referring to FIG. 22, a branch metric calculator 2210 receives an input signal by 6 symbols. For the states of 0 to 255, the branch metric calculator 2210 reads from the branch memory 2215 a branch value which is an output value for the input signal of 0 and 1.

The branch metric calculator 2210 calculates a branch metric when it is assumed that a state is '0' and an input signal is '0' for a value determined by multiplying the 6 symbols outputted from the convolutional encoder of FIG. 15, for the state '0' and the input signal '0', by the received 6 symbols and then adding the multiplied values.

The branch metric calculator 2210 calculates a branch metric when it is assumed that a state is '0' and an input signal is '1' for a value determined by multiplying the 6 symbols outputted from the convolutional encoder of FIG. 15, for the state '0' and the input signal '1', by the received 6 symbols and then adding the multiplied values.

The branch metric calculator 2210 calculates the branch metric values for each state and input signal in the same manner. Here, the branch metric value calculated for the state '0' and the input signal '0' means a probability value that the received signal for the state '0' and the input signal '0' will be identical to the above received signal. For the state 13='00001101' and the input signal '1', and for the state 12='00001100' and the input signal '1', the next state is identical. Upon receipt of the branch metric values calculated by the branch metric calculator 2210, a branch metric addition, comparison and selection device (ACS) 2220 reads from a state metric memory 2230 state metric values, which are the total branch metric values according to the paths for the previously stored states, and adds the read metric values to the corresponding branches of the states. The branch metric ACS 2220 selects a path having the higher branch value out of the two paths having the same next state and stores the state metric value for the state at that time in the state metric memory 2230. Further, the branch metric ACS 2220 stores the selected path for each state in a path memory 2240. This process is repeated until a set of 6 symbols are input for every input signal, and after completion of this process, the path memory 2240, which stores the paths for every state, outputs a path ending in a state '0'.

The values stored in the branch memory 2215 of the decoder vary according to the generator polynomial, and Table 5 below shows the values stored in the branch memory 2215 of the decoder corresponding to the R=1/6 convolutional encoder of FIG. 15. That is, although Table 5 is given for the convolutional encoder of FIG. 15, the values stored in the branch memory according to the different generator polynomials proposed in the invention indicate the 6 output symbols from the encoder according to one input value in each state. For example, when the state value stored in the registers of FIG. 15 is 27 and the input signal is '0', the encoder outputs a value of '−1,1,1,1,−1,−1'.

TABLE 5

| State | Input Signal = '0' | Input Signal = '1' |
|---|---|---|
| 0: | 1 1 1 1 1 1 | -1 -1 -1 -1 -1 -1 |
| 1: | -1 -1 -1 -1 -1 -1 | 1 1 1 1 1 1 |
| 2: | -1 1 1 -1 -1 -1 | 1 -1 -1 1 1 1 |
| 3: | 1 -1 -1 1 1 1 | -1 1 1 -1 -1 -1 |
| 4: | -1 -1 1 -1 1 -1 | 1 1 -1 1 -1 1 |
| 5: | 1 1 -1 1 -1 1 | -1 -1 1 -1 1 -1 |
| 6: | 1 -1 1 -1 1 1 | -1 1 -1 1 -1 -1 |
| 7: | -1 1 -1 1 -1 -1 | 1 -1 1 -1 1 1 |
| 8: | -1 -1 1 1 1 1 | 1 1 -1 -1 -1 -1 |
| 9: | 1 1 -1 -1 -1 -1 | -1 -1 1 1 1 1 |
| 10: | 1 -1 1 -1 1 -1 | -1 1 -1 1 -1 1 |
| 11: | -1 1 -1 1 1 1 | 1 -1 1 -1 -1 -1 |
| 12: | 1 1 1 -1 -1 1 | -1 -1 -1 1 1 -1 |
| 13: | -1 -1 -1 1 1 -1 | 1 1 1 -1 -1 1 |
| 14: | -1 1 -1 -1 1 1 | 1 -1 1 1 -1 -1 |
| 15: | 1 -1 1 1 -1 -1 | -1 1 -1 -1 1 1 |
| 16: | 1 1 -1 1 1 -1 | -1 -1 1 -1 -1 1 |
| 17: | -1 -1 1 -1 -1 1 | 1 1 -1 1 1 -1 |
| 18: | -1 1 1 1 -1 -1 | 1 -1 -1 -1 1 1 |
| 19: | 1 -1 -1 -1 1 1 | -1 1 1 1 -1 -1 |
| 20: | -1 1 1 -1 1 1 | 1 -1 -1 1 -1 -1 |
| 21: | 1 -1 -1 1 -1 -1 | -1 1 1 -1 1 1 |
| 22: | 1 -1 1 1 -1 1 | -1 1 -1 -1 1 -1 |
| 23: | -1 1 -1 -1 1 -1 | 1 -1 1 1 -1 1 |
| 24: | -1 -1 -1 -1 1 -1 | 1 1 1 1 -1 1 |
| 25: | 1 1 1 1 -1 1 | -1 -1 -1 -1 1 -1 |
| 26: | 1 -1 -1 -1 1 1 | -1 1 1 1 -1 -1 |
| 27: | -1 1 1 1 -1 -1 | 1 -1 -1 -1 1 1 |
| 28: | 1 1 -1 1 -1 1 | -1 -1 1 -1 1 -1 |
| 29: | -1 -1 1 -1 1 -1 | 1 1 -1 1 -1 1 |
| 30: | -1 1 -1 1 1 -1 | 1 -1 1 -1 -1 1 |
| 31: | 1 -1 1 -1 -1 1 | -1 1 -1 1 1 -1 |
| 32: | -1 -1 1 1 -1 -1 | 1 1 -1 -1 1 1 |
| 33: | 1 1 -1 -1 1 1 | -1 -1 1 1 -1 -1 |
| 34: | 1 -1 1 -1 -1 1 | -1 1 -1 1 1 -1 |
| 35: | -1 1 1 1 1 -1 | 1 -1 -1 -1 -1 1 |
| 36: | 1 1 -1 -1 1 -1 | -1 -1 1 1 -1 1 |
| 37: | -1 -1 1 1 -1 1 | 1 1 -1 -1 1 -1 |
| 38: | -1 1 -1 1 -1 1 | 1 -1 1 -1 1 -1 |
| 39: | 1 -1 1 -1 1 -1 | -1 1 -1 1 -1 1 |
| 40: | 1 1 1 -1 1 1 | -1 -1 -1 1 -1 -1 |
| 41: | -1 -1 -1 1 -1 -1 | 1 1 1 -1 1 1 |
| 42: | -1 1 1 1 1 -1 | 1 -1 -1 -1 -1 1 |
| 43: | 1 -1 -1 -1 -1 1 | -1 1 1 1 1 -1 |
| 44: | -1 -1 1 1 -1 1 | 1 1 -1 -1 1 -1 |
| 45: | 1 1 -1 -1 1 -1 | -1 -1 1 1 -1 1 |
| 46: | 1 -1 -1 1 -1 -1 | -1 1 1 -1 1 1 |
| 47: | -1 1 1 -1 1 1 | 1 -1 -1 1 -1 -1 |
| 48: | -1 -1 -1 -1 -1 1 | 1 1 1 1 1 -1 |
| 49: | 1 1 1 1 1 -1 | -1 -1 -1 -1 -1 1 |
| 50: | 1 -1 -1 1 1 -1 | -1 1 1 -1 -1 1 |
| 51: | -1 1 1 -1 -1 1 | 1 -1 -1 1 1 -1 |
| 52: | 1 1 -1 1 -1 -1 | -1 -1 1 -1 1 1 |
| 53: | -1 -1 1 -1 1 1 | 1 1 -1 1 -1 -1 |
| 54: | -1 1 1 -1 1 -1 | 1 -1 -1 1 -1 1 |
| 55: | 1 -1 -1 1 -1 1 | -1 1 1 -1 1 -1 |
| 56: | 1 1 1 1 -1 -1 | -1 -1 -1 -1 1 1 |
| 57: | -1 -1 -1 -1 1 1 | 1 1 1 1 -1 -1 |
| 58: | -1 1 -1 1 1 1 | 1 -1 1 -1 -1 -1 |
| 59: | 1 -1 1 -1 -1 -1 | -1 1 -1 1 1 1 |
| 60: | -1 -1 1 -1 -1 -1 | 1 1 -1 1 1 1 |
| 61: | 1 1 -1 1 1 1 | -1 -1 1 -1 -1 -1 |
| 62: | 1 -1 1 1 1 -1 | -1 1 -1 -1 -1 1 |
| 63: | -1 1 -1 -1 -1 1 | 1 -1 1 1 1 -1 |
| 64: | 1 -1 1 1 1 1 | -1 1 -1 -1 -1 -1 |
| 65: | -1 1 -1 -1 -1 -1 | 1 -1 1 1 1 1 |
| 66: | -1 -1 1 -1 1 1 | 1 1 -1 1 -1 -1 |
| 67: | 1 1 -1 1 -1 -1 | -1 -1 1 -1 1 1 |
| 68: | -1 1 1 1 -1 1 | 1 -1 -1 -1 1 -1 |
| 69: | 1 -1 -1 -1 1 -1 | -1 1 1 1 -1 1 |
| 70: | 1 1 1 -1 -1 -1 | -1 -1 -1 1 1 1 |
| 71: | -1 -1 -1 1 1 1 | 1 1 1 -1 -1 -1 |
| 72: | -1 1 1 -1 1 -1 | 1 -1 -1 1 -1 1 |
| 73: | 1 -1 -1 1 -1 1 | -1 1 1 -1 1 -1 |
| 74: | 1 1 1 -1 -1 -1 | -1 -1 -1 1 1 1 |
| 75: | -1 -1 -1 1 1 1 | 1 1 1 -1 -1 -1 |
| 76: | 1 -1 1 1 -1 1 | -1 1 -1 -1 1 -1 |
| 77: | -1 1 -1 -1 1 -1 | 1 -1 1 1 -1 1 |
| 78: | -1 -1 1 -1 1 -1 | 1 1 -1 1 -1 1 |
| 79: | 1 1 -1 1 -1 1 | -1 -1 1 -1 1 -1 |
| 80: | 1 -1 -1 -1 1 1 | -1 1 1 1 -1 -1 |
| 81: | -1 1 1 1 -1 -1 | 1 -1 -1 -1 1 1 |
| 82: | -1 -1 1 1 -1 1 | 1 1 -1 -1 1 -1 |
| 83: | 1 1 -1 -1 1 -1 | -1 -1 1 1 -1 1 |
| 84: | -1 1 -1 1 1 1 | 1 -1 1 -1 -1 1 |
| 85: | 1 1 -1 -1 1 1 | -1 -1 1 1 -1 -1 |
| 86: | 1 1 1 -1 -1 1 | -1 -1 -1 1 1 -1 |
| 87: | -1 -1 1 1 1 -1 | 1 1 -1 -1 -1 1 |
| 88: | -1 1 1 1 1 1 | 1 -1 -1 -1 -1 -1 |
| 89: | 1 -1 -1 -1 -1 1 | -1 1 1 1 1 1 |
| 90: | 1 1 -1 -1 -1 -1 | -1 -1 1 1 1 1 |
| 91: | -1 -1 1 1 1 1 | 1 1 -1 -1 -1 -1 |
| 92: | 1 -1 1 -1 1 1 | -1 1 -1 1 -1 -1 |
| 93: | -1 1 -1 1 -1 1 | 1 -1 1 -1 1 -1 |
| 94: | -1 -1 1 1 -1 -1 | 1 1 -1 -1 1 1 |
| 95: | 1 1 -1 -1 1 1 | -1 -1 1 1 -1 -1 |
| 96: | -1 1 1 -1 1 -1 | 1 -1 -1 1 -1 1 |
| 97: | 1 -1 -1 1 -1 1 | -1 1 1 -1 1 -1 |
| 98: | 1 1 -1 1 -1 -1 | -1 -1 1 -1 1 1 |
| 99: | -1 -1 1 -1 1 1 | 1 1 -1 1 -1 -1 |
| 100: | 1 1 -1 1 1 -1 | -1 -1 1 -1 -1 1 |
| 101: | -1 -1 1 -1 -1 1 | 1 1 -1 1 1 -1 |
| 102: | -1 1 1 -1 -1 1 | 1 -1 -1 1 1 -1 |
| 103: | 1 -1 -1 1 1 -1 | -1 1 1 -1 -1 1 |
| 104: | 1 -1 -1 -1 -1 1 | -1 1 1 1 1 -1 |
| 105: | -1 1 1 1 -1 -1 | 1 -1 -1 -1 -1 1 |
| 106: | -1 -1 -1 1 1 1 | 1 1 1 -1 -1 -1 |
| 107: | 1 1 1 -1 -1 -1 | -1 -1 -1 1 1 1 |
| 108: | -1 1 -1 -1 1 1 | 1 -1 1 1 -1 -1 |
| 109: | 1 -1 1 1 -1 -1 | -1 1 -1 -1 1 1 |
| 110: | 1 1 -1 1 1 1 | -1 -1 1 -1 -1 -1 |
| 111: | -1 -1 1 -1 -1 -1 | 1 1 -1 1 1 1 |
| 112: | -1 1 1 1 1 -1 | 1 -1 -1 -1 -1 1 |
| 113: | 1 -1 -1 -1 -1 1 | -1 1 1 1 1 -1 |
| 114: | 1 1 1 1 -1 1 | -1 -1 -1 -1 1 -1 |
| 115: | -1 -1 -1 -1 1 -1 | 1 1 1 1 -1 1 |
| 116: | 1 1 1 -1 1 -1 | -1 -1 -1 1 -1 1 |
| 117: | -1 1 -1 1 -1 1 | 1 -1 1 -1 1 -1 |
| 118: | -1 1 -1 1 1 -1 | 1 -1 1 -1 -1 1 |
| 119: | 1 -1 1 -1 -1 1 | -1 1 -1 1 1 -1 |
| 120: | 1 -1 1 1 -1 -1 | -1 1 -1 -1 1 1 |
| 121: | -1 1 -1 -1 1 1 | 1 -1 1 1 -1 -1 |
| 122: | -1 -1 -1 1 -1 1 | 1 1 1 -1 1 -1 |
| 123: | 1 1 1 -1 1 -1 | -1 -1 -1 1 -1 1 |
| 124: | -1 1 -1 1 1 -1 | 1 -1 1 -1 -1 1 |
| 125: | 1 -1 1 -1 -1 1 | -1 1 -1 1 1 -1 |
| 126: | 1 1 1 -1 1 -1 | -1 -1 -1 1 -1 1 |
| 127: | -1 -1 -1 1 -1 1 | 1 1 1 -1 1 -1 |
| 128: | 1 -1 1 1 1 -1 | -1 1 -1 -1 -1 1 |
| 129: | -1 1 -1 -1 -1 1 | 1 -1 1 1 1 -1 |
| 130: | -1 -1 1 -1 1 -1 | 1 1 -1 1 -1 1 |
| 131: | 1 1 -1 1 -1 1 | -1 -1 1 -1 1 -1 |
| 132: | -1 1 1 1 -1 1 | 1 -1 -1 -1 1 -1 |
| 133: | 1 -1 -1 -1 1 -1 | -1 1 1 1 -1 1 |
| 134: | 1 -1 1 1 -1 -1 | -1 1 -1 -1 1 1 |
| 135: | -1 1 -1 -1 1 1 | 1 -1 1 1 -1 -1 |
| 136: | -1 1 -1 1 1 -1 | 1 -1 1 -1 -1 1 |
| 137: | 1 -1 1 -1 -1 1 | -1 1 -1 1 1 -1 |
| 138: | 1 1 -1 -1 1 -1 | -1 -1 1 1 -1 1 |
| 139: | -1 -1 1 1 -1 1 | 1 1 -1 -1 1 -1 |
| 140: | 1 -1 1 -1 1 1 | -1 1 -1 1 -1 -1 |
| 141: | -1 1 -1 1 -1 -1 | 1 -1 1 -1 1 1 |
| 142: | -1 -1 1 1 1 1 | 1 1 -1 -1 -1 -1 |
| 143: | 1 1 -1 -1 -1 -1 | -1 -1 1 1 1 1 |
| 144: | 1 -1 1 1 -1 1 | -1 1 -1 -1 1 -1 |
| 145: | -1 1 -1 -1 1 -1 | 1 -1 1 1 -1 1 |
| 146: | -1 -1 -1 1 1 -1 | 1 1 1 -1 -1 1 |
| 147: | 1 1 1 -1 -1 1 | -1 -1 -1 1 1 -1 |
| 148: | 1 -1 -1 1 1 1 | -1 1 1 -1 -1 -1 |
| 149: | -1 1 1 -1 -1 -1 | 1 -1 -1 1 1 1 |
| 150: | 1 1 1 1 1 -1 | -1 -1 -1 -1 -1 1 |
| 151: | -1 -1 -1 -1 -1 1 | 1 1 1 1 1 -1 |
| 152: | -1 -1 1 -1 1 1 | -1 1 -1 1 -1 -1 |
| 153: | 1 -1 1 1 -1 1 | -1 1 -1 -1 1 -1 |

TABLE 5-continued

| State | Input Signal = '0' | | | | | | Input Signal = '1' | | | | | |
|---|---|---|---|---|---|---|---|---|---|---|---|---|
| 154: | 1 | 1 | -1 | 1 | 1 | -1 | -1 | -1 | 1 | -1 | -1 | 1 |
| 155: | -1 | -1 | 1 | -1 | -1 | 1 | 1 | 1 | -1 | 1 | 1 | -1 |
| 156: | 1 | -1 | -1 | 1 | -1 | -1 | -1 | 1 | 1 | -1 | 1 | 1 |
| 157: | -1 | 1 | 1 | -1 | 1 | 1 | 1 | -1 | -1 | 1 | -1 | -1 |
| 158: | -1 | -1 | -1 | 1 | 1 | 1 | 1 | 1 | 1 | -1 | -1 | -1 |
| 159: | 1 | 1 | 1 | 1 | -1 | -1 | -1 | -1 | -1 | -1 | 1 | 1 |
| 160: | -1 | 1 | -1 | -1 | 1 | -1 | 1 | -1 | 1 | 1 | -1 | 1 |
| 161: | 1 | -1 | 1 | 1 | -1 | 1 | -1 | 1 | -1 | -1 | 1 | -1 |
| 162: | 1 | 1 | -1 | 1 | -1 | 1 | -1 | -1 | 1 | -1 | 1 | -1 |
| 163: | -1 | -1 | 1 | -1 | 1 | -1 | 1 | 1 | -1 | 1 | -1 | 1 |
| 164: | 1 | -1 | 1 | 1 | 1 | -1 | -1 | 1 | -1 | -1 | -1 | 1 |
| 165: | -1 | 1 | -1 | -1 | -1 | 1 | 1 | -1 | 1 | 1 | 1 | -1 |
| 166: | -1 | -1 | -1 | -1 | 1 | 1 | 1 | 1 | 1 | 1 | -1 | -1 |
| 167: | 1 | 1 | 1 | 1 | -1 | -1 | -1 | -1 | -1 | -1 | 1 | 1 |
| 168: | 1 | 1 | 1 | -1 | 1 | -1 | -1 | -1 | -1 | 1 | -1 | 1 |
| 169: | -1 | 1 | -1 | -1 | -1 | 1 | 1 | -1 | 1 | 1 | 1 | -1 |
| 170: | -1 | -1 | 1 | -1 | -1 | 1 | 1 | 1 | -1 | 1 | 1 | -1 |
| 171: | 1 | 1 | -1 | 1 | 1 | -1 | -1 | -1 | 1 | -1 | -1 | 1 |
| 172: | -1 | 1 | 1 | 1 | 1 | 1 | 1 | -1 | -1 | -1 | -1 | -1 |
| 173: | 1 | -1 | 1 | 1 | -1 | -1 | -1 | 1 | -1 | -1 | 1 | 1 |
| 174: | 1 | 1 | 1 | 1 | 1 | -1 | -1 | -1 | -1 | -1 | -1 | 1 |
| 175: | -1 | -1 | -1 | -1 | -1 | 1 | 1 | 1 | 1 | 1 | 1 | -1 |
| 176: | -1 | -1 | 1 | 1 | -1 | 1 | 1 | 1 | -1 | -1 | 1 | -1 |
| 177: | 1 | -1 | 1 | -1 | 1 | -1 | -1 | 1 | -1 | 1 | -1 | 1 |
| 178: | 1 | 1 | 1 | 1 | 1 | -1 | -1 | -1 | -1 | -1 | -1 | 1 |
| 179: | -1 | -1 | 1 | 1 | 1 | 1 | 1 | 1 | -1 | -1 | -1 | -1 |
| 180: | 1 | -1 | -1 | -1 | -1 | -1 | -1 | 1 | 1 | 1 | 1 | 1 |
| 181: | -1 | 1 | 1 | 1 | 1 | 1 | 1 | -1 | -1 | -1 | -1 | -1 |
| 182: | -1 | -1 | 1 | 1 | 1 | 1 | 1 | 1 | -1 | -1 | -1 | -1 |
| 183: | 1 | 1 | -1 | -1 | 1 | -1 | -1 | -1 | 1 | 1 | -1 | 1 |
| 184: | 1 | -1 | 1 | -1 | 1 | -1 | -1 | 1 | -1 | 1 | -1 | 1 |
| 185: | -1 | 1 | -1 | 1 | -1 | 1 | 1 | -1 | 1 | -1 | 1 | -1 |
| 186: | -1 | -1 | 1 | 1 | 1 | 1 | 1 | 1 | -1 | -1 | -1 | -1 |
| 187: | 1 | 1 | -1 | -1 | 1 | -1 | -1 | -1 | 1 | 1 | -1 | 1 |
| 188: | -1 | 1 | 1 | -1 | 1 | 1 | 1 | -1 | -1 | 1 | -1 | -1 |
| 189: | 1 | -1 | -1 | -1 | 1 | 1 | -1 | 1 | 1 | 1 | -1 | -1 |
| 190: | 1 | 1 | 1 | -1 | 1 | 1 | -1 | -1 | -1 | 1 | -1 | -1 |
| 191: | -1 | -1 | 1 | 1 | -1 | -1 | 1 | 1 | -1 | -1 | 1 | 1 |
| 192: | 1 | 1 | -1 | -1 | 1 | 1 | -1 | -1 | 1 | 1 | -1 | -1 |
| 193: | -1 | 1 | 1 | 1 | -1 | 1 | 1 | -1 | -1 | -1 | 1 | -1 |
| 194: | -1 | 1 | 1 | 1 | 1 | -1 | 1 | -1 | -1 | -1 | -1 | 1 |
| 195: | 1 | 1 | -1 | -1 | 1 | -1 | -1 | -1 | 1 | 1 | -1 | 1 |
| 196: | -1 | -1 | -1 | 1 | 1 | 1 | 1 | 1 | 1 | -1 | -1 | -1 |
| 197: | 1 | 1 | 1 | -1 | 1 | 1 | -1 | -1 | -1 | 1 | -1 | -1 |
| 198: | 1 | -1 | -1 | 1 | 1 | 1 | -1 | 1 | 1 | -1 | -1 | -1 |
| 199: | -1 | 1 | 1 | -1 | 1 | 1 | 1 | -1 | -1 | 1 | -1 | -1 |
| 200: | -1 | -1 | 1 | -1 | 1 | 1 | 1 | 1 | -1 | 1 | -1 | -1 |
| 201: | 1 | 1 | -1 | -1 | 1 | -1 | -1 | -1 | 1 | 1 | -1 | 1 |
| 202: | 1 | -1 | 1 | -1 | -1 | -1 | -1 | 1 | -1 | 1 | 1 | 1 |
| 203: | -1 | 1 | -1 | 1 | -1 | 1 | 1 | -1 | 1 | -1 | 1 | -1 |
| 204: | 1 | 1 | -1 | -1 | 1 | -1 | -1 | -1 | 1 | 1 | -1 | 1 |
| 205: | -1 | -1 | -1 | 1 | 1 | 1 | 1 | 1 | 1 | -1 | -1 | -1 |
| 206: | -1 | 1 | 1 | 1 | 1 | 1 | 1 | -1 | -1 | -1 | -1 | -1 |
| 207: | 1 | -1 | -1 | -1 | -1 | -1 | -1 | 1 | 1 | 1 | 1 | 1 |
| 208: | 1 | -1 | 1 | -1 | 1 | -1 | -1 | 1 | -1 | 1 | -1 | 1 |
| 209: | -1 | 1 | 1 | 1 | -1 | 1 | 1 | -1 | -1 | -1 | 1 | -1 |
| 210: | -1 | 1 | -1 | -1 | 1 | -1 | 1 | -1 | 1 | 1 | -1 | 1 |
| 211: | 1 | -1 | 1 | 1 | -1 | 1 | -1 | 1 | -1 | -1 | 1 | -1 |
| 212: | -1 | -1 | -1 | 1 | -1 | 1 | 1 | 1 | 1 | -1 | 1 | -1 |
| 213: | 1 | 1 | 1 | 1 | -1 | -1 | -1 | -1 | -1 | -1 | 1 | 1 |
| 214: | 1 | -1 | -1 | 1 | -1 | -1 | -1 | 1 | 1 | -1 | 1 | 1 |
| 215: | -1 | 1 | -1 | 1 | 1 | 1 | 1 | -1 | 1 | -1 | -1 | -1 |
| 216: | 1 | 1 | 1 | -1 | 1 | 1 | -1 | -1 | -1 | 1 | -1 | -1 |
| 217: | 1 | -1 | 1 | 1 | -1 | -1 | -1 | 1 | -1 | -1 | 1 | 1 |
| 218: | 1 | 1 | 1 | -1 | 1 | 1 | -1 | -1 | -1 | 1 | -1 | -1 |
| 219: | -1 | 1 | -1 | -1 | 1 | 1 | 1 | -1 | 1 | 1 | -1 | -1 |
| 220: | 1 | 1 | 1 | 1 | 1 | 1 | -1 | -1 | -1 | -1 | -1 | -1 |
| 221: | -1 | -1 | -1 | -1 | -1 | -1 | 1 | 1 | 1 | 1 | 1 | 1 |
| 222: | -1 | -1 | 1 | -1 | -1 | -1 | 1 | 1 | -1 | 1 | 1 | 1 |
| 223: | 1 | -1 | 1 | 1 | -1 | 1 | -1 | 1 | -1 | -1 | 1 | -1 |
| 244: | -1 | -1 | 1 | -1 | 1 | 1 | 1 | 1 | -1 | 1 | -1 | -1 |
| 225: | 1 | 1 | -1 | 1 | 1 | 1 | -1 | -1 | 1 | -1 | -1 | -1 |
| 226: | 1 | -1 | 1 | 1 | 1 | -1 | -1 | 1 | -1 | -1 | -1 | 1 |
| 227: | -1 | 1 | -1 | -1 | -1 | 1 | 1 | -1 | 1 | 1 | 1 | -1 |
| 228: | 1 | 1 | 1 | -1 | -1 | -1 | -1 | -1 | -1 | 1 | 1 | 1 |
| 229: | -1 | -1 | -1 | 1 | 1 | 1 | 1 | 1 | 1 | -1 | -1 | -1 |
| 230: | 1 | -1 | 1 | -1 | 1 | 1 | 1 | -1 | 1 | -1 | -1 | -1 |
| 231: | 1 | -1 | -1 | 1 | -1 | -1 | -1 | 1 | 1 | -1 | 1 | 1 |
| 232: | 1 | 1 | -1 | 1 | -1 | 1 | -1 | -1 | 1 | -1 | 1 | -1 |
| 233: | -1 | -1 | 1 | -1 | 1 | -1 | 1 | 1 | -1 | 1 | -1 | 1 |
| 234: | -1 | 1 | -1 | -1 | 1 | -1 | 1 | -1 | 1 | 1 | -1 | 1 |
| 235: | 1 | -1 | 1 | 1 | -1 | 1 | -1 | 1 | -1 | -1 | 1 | -1 |
| 236: | -1 | -1 | -1 | -1 | -1 | -1 | 1 | 1 | 1 | 1 | 1 | 1 |
| 237: | 1 | 1 | 1 | 1 | 1 | 1 | -1 | -1 | -1 | -1 | -1 | -1 |
| 238: | 1 | -1 | -1 | 1 | 1 | 1 | -1 | 1 | 1 | -1 | -1 | -1 |
| 239: | -1 | 1 | 1 | -1 | -1 | 1 | 1 | -1 | -1 | 1 | 1 | -1 |
| 240: | -1 | 1 | 1 | 1 | 1 | -1 | 1 | 1 | -1 | -1 | -1 | 1 |
| 241: | 1 | 1 | -1 | -1 | -1 | 1 | -1 | -1 | 1 | 1 | 1 | -1 |
| 242: | 1 | -1 | 1 | -1 | -1 | 1 | -1 | 1 | -1 | 1 | 1 | -1 |
| 243: | -1 | 1 | -1 | 1 | 1 | -1 | 1 | -1 | 1 | -1 | -1 | 1 |
| 244: | 1 | 1 | -1 | 1 | 1 | 1 | -1 | -1 | 1 | -1 | -1 | -1 |
| 245: | -1 | -1 | -1 | 1 | -1 | -1 | 1 | 1 | 1 | -1 | 1 | 1 |
| 246: | -1 | 1 | 1 | 1 | -1 | -1 | 1 | -1 | -1 | -1 | 1 | 1 |
| 247: | 1 | -1 | -1 | -1 | 1 | 1 | -1 | 1 | 1 | 1 | -1 | -1 |
| 248: | 1 | 1 | -1 | 1 | 1 | -1 | -1 | -1 | 1 | -1 | -1 | 1 |
| 249: | -1 | -1 | 1 | 1 | -1 | 1 | 1 | 1 | -1 | -1 | 1 | -1 |
| 250: | -1 | 1 | -1 | 1 | -1 | 1 | 1 | -1 | 1 | -1 | 1 | -1 |
| 251: | 1 | -1 | 1 | -1 | 1 | -1 | -1 | 1 | -1 | 1 | -1 | 1 |
| 252: | -1 | -1 | 1 | -1 | 1 | -1 | 1 | 1 | -1 | 1 | -1 | 1 |
| 253: | 1 | 1 | 1 | -1 | -1 | -1 | -1 | -1 | -1 | 1 | 1 | 1 |
| 254: | 1 | -1 | -1 | -1 | -1 | -1 | -1 | 1 | 1 | 1 | 1 | 1 |
| 255: | -1 | 1 | 1 | 1 | 1 | 1 | 1 | -1 | -1 | -1 | -1 | -1 |

As described above, in a multicarrier system employing the frequency overlay method, the respective carriers have limited transmission powers according to the loading in the frequency bands of the IS-95 system, which results in loss of data received at one or more carrier frequency bands. To solve this problem, by using certain selected generator polynomials for the channel encoder and a symbol distribution method, it is possible to provide a high coding gain against the data loss due to the carrier loss, thereby preventing degradation of the BER. In addition, the weight distribution is superior to that of the R=1/6 convolutional encoder having the conventional generator polynomial, in the DS-CDMA system using the R=1/6 convolutional encoder.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A communication device for a direct sequence code division multiple access (DS-CDMA) communication system, comprising:
  a CRC (Cyclic Redundancy Check) generator for generating CRC bits according to input data bits and adding the generated CRC bits to the input data bits;
  a channel encoder for encoding the CRC-added data bits using a coding rate R=1/6 convolutional code of a generator polynomial of (457, 755, 551, 637, 625, 727); and
  an interleaver for interleaving the coded data bits.

2. The communication device as claimed in claim 1, wherein the channel encoder comprises:
  a plurality of delays for delaying the input data bits to output first to eighth delayed data bits;
  a first operator for exclusively ORing the input data bits and the third, fifth, sixth, seventh and eighth delayed data bits to generate a first symbol;
  a second operator for exclusively ORing the input data bits and the first, second, third, fifth, sixth and eighth delayed data bits to generate a second symbol;

a third operator for exclusively ORing the input data bits and the second, third, fifth and eighth delayed data bits to generate a third symbol;

a fourth operator for exclusively ORing the input data bits and the first, fourth, fifth, sixth, seventh and eighth delayed data bits to generate a fourth symbol;

a fifth operator for exclusively ORing the input data bits and the first, fourth, sixth and eighth delayed data bits to generate a fifth symbol; and a sixth operator for exclusively ORing the input data bits and the first, second, fourth, sixth, seventh and eighth delayed data bits to generate a sixth symbol.

3. A communication method for a direct sequence code division multiple access (DS-CDMA) communication system, comprising the steps of:

generating Cyclic Redundancy Check (CRC) bits according to input data bits and adding the generated CRC bits to the input data bits;

encoding the CRC-added data bits using a R=1/6 convolutional code of a generator polynomial of (457, 755, 551, 637, 625, 727); and interleaving the coded data bits.

\* \* \* \* \*